United States Patent
Sabharwal et al.

(10) Patent No.: US 11,646,743 B1
(45) Date of Patent: May 9, 2023

(54) DIGITAL PHASE-LOCKED LOOP

(71) Applicant: NXP USA, Inc., Austin, TX (US)

(72) Inventors: Pawan Sabharwal, Ghaziabad (IN); Anand Kumar Sinha, Noida (IN); Krishna Thakur, GautamBudh Nagar (IN); Deependra Kumar Jain, Noida (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/654,073

(22) Filed: Mar. 9, 2022

(51) Int. Cl.
*G04F 10/00* (2006.01)
*H03L 7/095* (2006.01)
*H03L 7/10* (2006.01)
*H03L 7/099* (2006.01)
*H03L 7/107* (2006.01)
*H03L 7/093* (2006.01)

(52) U.S. Cl.
CPC ............ *H03L 7/103* (2013.01); *G04F 10/005* (2013.01); *H03L 7/093* (2013.01); *H03L 7/095* (2013.01); *H03L 7/0995* (2013.01); *H03L 7/1075* (2013.01)

(58) Field of Classification Search
CPC .................. G04F 10/005; H03L 7/085; H03L 7/091–095; H03L 7/099; H03L 7/0995; H03L 7/10–104; H03L 7/18
See application file for complete search history.

(56) References Cited

U.S. PATENT DOCUMENTS

| 7,042,972 | B2 | 5/2006 | Fahim | |
|---|---|---|---|---|
| 7,425,874 | B2* | 9/2008 | Risbo | H03L 7/0991 375/376 |
| 8,022,849 | B2 | 9/2011 | Zhang et al. | |
| 8,433,025 | B2 | 4/2013 | Sun et al. | |
| 11,075,638 | B1 | 7/2021 | Sinha et al. | |
| 2007/0025490 | A1* | 2/2007 | Azadet | H03L 7/087 375/376 |
| 2009/0267664 | A1* | 10/2009 | Uozumi | H03L 7/193 327/158 |

* cited by examiner

*Primary Examiner* — Patrick O Neill

(57) ABSTRACT

A digital phase-locked loop (PLL) includes a time-to-digital converter (TDC) and a digitally controlled oscillator (DCO). The DCO generates a PLL clock signal and various sampling clock signals that are mesochronous. The TDC samples a phase difference between a reference clock signal and a frequency-divided version of the PLL clock signal based on the sampling clock signals and various enable signals. The enable signals are generated based on a calibration of the digital PLL. Each enable signal is associated with a sampling clock signal and indicates whether the associated sampling clock signal is to be utilized for sampling the phase difference. Further, the TDC generates control data indicative of the sampled phase difference. The DCO generates the PLL clock signal and the sampling clock signals based on the control data until the digital PLL is in a phase-locked state.

20 Claims, 6 Drawing Sheets

Storage element 110

| Plurality of predefined frequencies | Predefined calibration data set | Plurality of predefined values |
|---|---|---|
| PF1 | PD1 | PV1 |
| PF2 | PD2 | PV2 |
| PF3 | PD3 | PV3 |

… # DIGITAL PHASE-LOCKED LOOP

FIELD OF USE

The present disclosure relates generally to electronic circuits, and, more particularly, to a digital phase-locked loop.

BACKGROUND

Integrated circuits (ICs) include various phase-locked loops (PLLs) to generate clock signals of desired frequency and phase. Typically, the PLLs utilized in the ICs operate in the analog domain (e.g., include analog components). Such analog PLLs occupy a significant area on the ICs. Further, the manufacturing cost of the analog PLLs is significant.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

FIG. 4 illustrates a schematic diagram of a storage element of the IC of FIG. 1 in accordance with an embodiment of the present disclosure.

DETAILED DESCRIPTION

Figure 1:
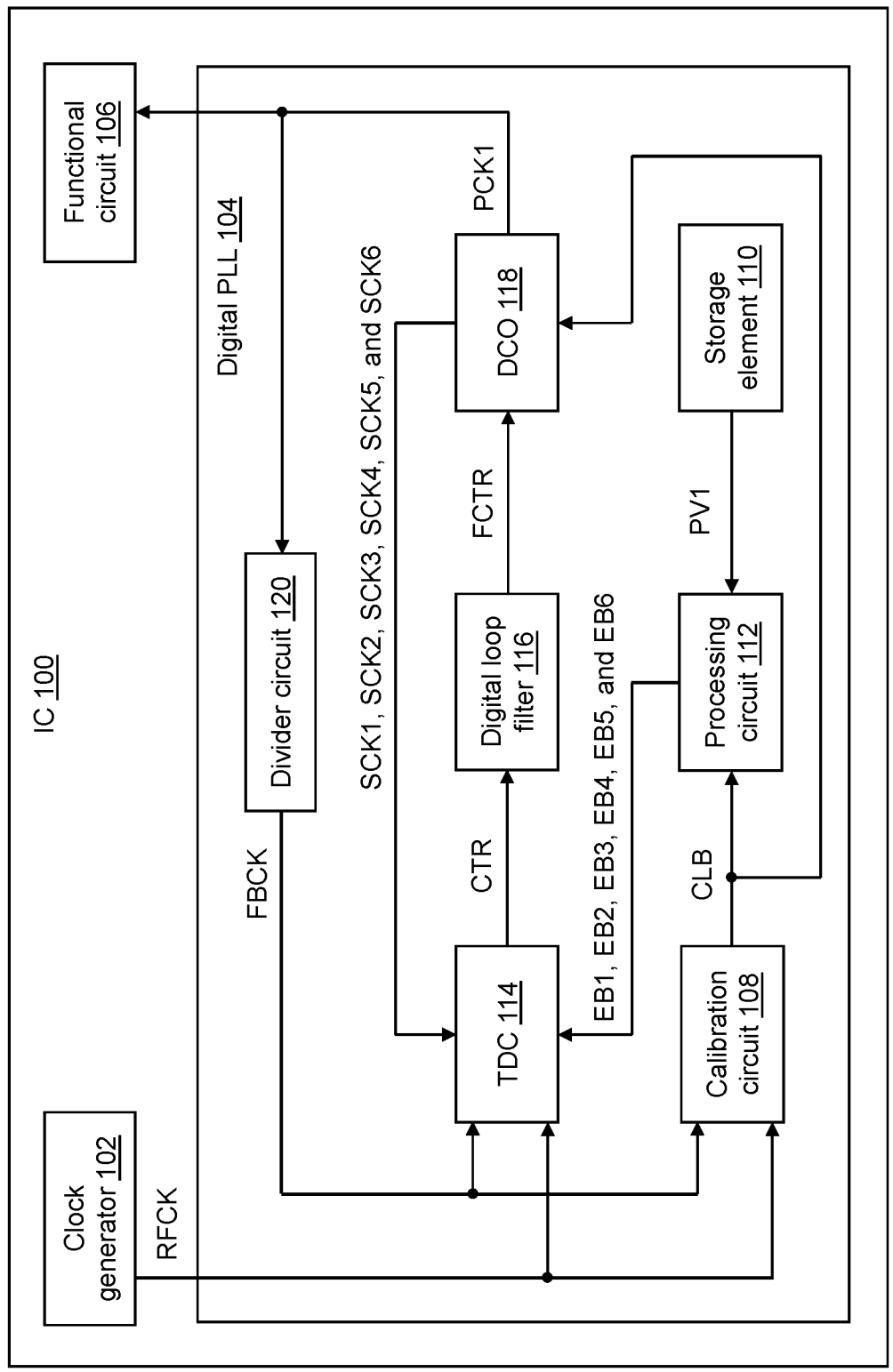
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, a digital phase-locked loop (PLL) is disclosed. The digital PLL may include a digitally controlled oscillator (DCO) and a time-to-digital converter (TDC) that may be coupled to the DCO. The DCO may be configured to generate a PLL clock signal and a plurality of sampling clock signals. The plurality of sampling clock signals is mesochronous. The TDC may be configured to sample, based on the plurality of sampling clock signals and a plurality of enable signals, a phase difference between a reference clock signal and a feedback clock signal. The feedback clock signal may be derived from the PLL clock signal. Further, the plurality of enable signals may be generated based on a calibration of the digital PLL. Each enable signal of the plurality of enable signals is associated with a sampling clock signal of the plurality of sampling clock signals and indicates whether the associated sampling clock signal is to be utilized for sampling the phase difference between the reference clock signal and the feedback clock signal. Further, the TDC may be configured to generate control data indicative of the sampled phase difference. After the digital PLL is calibrated, the DCO may generate the plurality of sampling clock signals and the PLL clock signal based on the control data such that the phase difference between the reference clock signal and the feedback clock signal is less than a tolerance limit associated with the digital PLL.

In another embodiment of the present disclosure, a phase-locking method for a digital PLL is disclosed. The phase-locking method may include generating a PLL clock signal and a plurality of sampling clock signals by a DCO of the digital PLL. The plurality of sampling clock signals is mesochronous. The phase-locking method may further include sampling a phase difference between a reference clock signal and a feedback clock signal by a TDC of the digital PLL. The feedback clock signal may be derived from the PLL clock signal. The phase difference between the reference clock signal and the feedback clock signal is sampled based on the plurality of sampling clock signals and a plurality of enable signals. The plurality of enable signals may be generated based on a calibration of the digital PLL. Each enable signal of the plurality of enable signals is associated with a sampling clock signal of the plurality of sampling clock signals and indicates whether the associated sampling clock signal is to be utilized for sampling the phase difference between the reference clock signal and the feedback clock signal. Further, the phase-locking method may include generating control data indicative of the sampled phase difference by the TDC. After the digital PLL is calibrated, the plurality of sampling clock signals and the PLL clock signal are generated based on the control data such that the phase difference between the feedback clock signal and the reference clock signal is less than a tolerance limit associated with the digital PLL.

In some embodiments, after the digital PLL is calibrated, the DCO generates the plurality of sampling clock signals and the PLL clock signal further based on calibration data. The calibration data is generated based on a coarse frequency matching between the reference clock signal and the feedback clock signal during the calibration of the digital PLL.

In some embodiments, the digital PLL may further include a storage element. The storage element may be configured to store a mapping between a plurality of predefined frequencies, a predefined calibration data set, and a plurality of predefined values. Each predefined value of the plurality of predefined values is indicative of a number of sampling clock signals of the plurality of sampling clock signals that are to be utilized for sampling the phase difference between the reference clock signal and the feedback clock signal.

In some embodiments, the digital PLL may further include a processing circuit that may be coupled to the storage element. The processing circuit may be configured to compare a locking frequency of the digital PLL with each predefined frequency of the plurality of predefined frequencies. Further, the processing circuit may be configured to compare calibration data with each predefined data of the predefined calibration data set. The calibration data is generated based on a coarse frequency matching between the reference clock signal and the feedback clock signal during the calibration of the digital PLL. The processing circuit may be further configured to identify, from the plurality of predefined values to facilitate the generation of the plurality of enable signals, a first predefined value that is associated with the locking frequency of the digital PLL and the calibration data. The first predefined value is identified based on the comparison of the locking frequency of the digital PLL with each predefined frequency of the plurality of predefined frequencies and the comparison of the calibration data with each predefined data of the predefined calibration data set.

In some embodiments, the feedback clock signal is derived from the PLL clock signal such that a frequency of the feedback clock signal corresponds to a result of a division of a frequency of the PLL clock signal by a division factor. The processing circuit may be further configured to determine the locking frequency of the digital PLL based on a product of a frequency of the reference clock signal and the division factor.

In some embodiments, the processing circuit may be further coupled to the TDC. The processing circuit may be further configured to generate the plurality of enable signals based on the first predefined value such that one or more enable signals of the plurality of enable signals are asserted and remaining enable signals of the plurality of enable signals are de-asserted. Further, the processing circuit may be configured to provide the plurality of enable signals to the TDC to control the TDC after the calibration of the digital PLL. The TDC may sample the phase difference between the reference clock signal and the feedback clock signal based on one or more sampling clock signals of the plurality of sampling clock signals that are associated with the one or more enable signals, respectively.

In some embodiments, a loop transfer function of the digital PLL is controlled based on a gain of the DCO and the first predefined value.

In some embodiments, the TDC may include a phase frequency detector. The phase frequency detector may be configured to receive the reference clock signal and the feedback clock signal and generate a start signal and a stop signal to sample the phase difference between the reference clock signal and the feedback clock signal. The start signal is asserted based on an assertion of one of a group consisting of the reference clock signal and the feedback clock signal. When the start signal is asserted based on the assertion of the reference clock signal, the stop signal is asserted based on the assertion of the feedback clock signal. Conversely, when the start signal is asserted based on the assertion of the feedback clock signal, the stop signal is asserted based on the assertion of the reference clock signal. A time duration between the assertion of the start signal and the assertion of the stop signal is indicative of the phase difference between the reference clock signal and the feedback clock signal.

In some embodiments, the TDC may further include a plurality of counters that may be coupled to the phase frequency detector and the DCO, and an adder that may be coupled to the plurality of counters. The plurality of counters may be configured to receive the start signal and the stop signal. The plurality of counters may be further configured to receive the plurality of enable signals and the plurality of sampling clock signals. Each counter of the plurality of counters is activated based on an assertion of an associated enable signal of the plurality of enable signals. Further, the plurality of counters may be configured to generate a plurality of count values that is indicative of the sampled phase difference between the reference clock signal and the feedback clock signal. The plurality of count values is incremented based on the assertion of the start signal and transitions of the plurality of sampling clock signals. The plurality of counters is halted based on the assertion of the stop signal. Further, the adder may be configured to generate the control data based on the plurality of count values such that the control data corresponds to a sum of the plurality of count values.

In some embodiments, the digital PLL may further include a digital loop filter that may be coupled to the TDC and the DCO. The digital loop filter may be configured to receive the control data from the TDC and generate filtered control data. The digital loop filter may be further configured to provide the filtered control data to the DCO to facilitate the generation of the plurality of sampling clock signals and the PLL clock signal after the digital PLL is calibrated.

In some embodiments, the DCO may include a ring oscillator. The ring oscillator may be configured to generate a plurality of PLL clock signals based on a sum of a first drive current and a second drive current. The first drive current is derived from calibration data whereas the second drive current is derived from the control data. The calibration data is generated based on a coarse frequency matching between the reference clock signal and the feedback clock signal during the calibration of the digital PLL. The plurality of PLL clock signals includes the PLL clock signal. The plurality of sampling clock signals is derived from the plurality of PLL clock signals.

In some embodiments, the DCO may further include a plurality of single-to-differential converters that may be coupled to the ring oscillator. The plurality of single-to-differential converters may be configured to generate the plurality of sampling clock signals based on the plurality of PLL clock signals. A first single-to-differential converter of the plurality of single-to-differential converters may be configured to generate, based on the PLL clock signal, a first sampling clock signal of the plurality of sampling clock signals and a second sampling clock signal of the plurality of sampling clock signals. The first sampling clock signal is in phase with the PLL clock signal and the second sampling clock signal is an inverted version of the first sampling clock signal.

In some embodiments, the DCO may further include a bias circuit, a first binary-to-thermometer decoder, and a second binary-to-thermometer decoder. The bias circuit may be configured to generate a bias current. The first binary-to-thermometer decoder may be configured to receive the calibration data and convert the calibration data that is in a binary code format to first thermometer data that is in a thermometer code format. Similarly, the second binary-to-thermometer decoder may be configured to receive filtered control data and convert the filtered control data that is in the binary code format to second thermometer data that is in the thermometer code format. The filtered control data is generated based on filtration of the control data. The DCO may further include a first digital-to-analog converter (DAC) and a second DAC that may be coupled to the first binary-to-thermometer decoder and the second binary-to-thermometer decoder, respectively. The first and second DACs may be further coupled to the bias circuit. The first DAC may be configured to generate the first drive current based on the first thermometer data and the bias current. Similarly, the second DAC may be configured to generate the second drive current based on the second thermometer data and the bias current.

In some embodiments, the digital PLL may further include a calibration circuit that may be coupled to the DCO. During the calibration of the digital PLL, the calibration circuit may be configured to receive the reference clock signal and the feedback clock signal. To calibrate the digital PLL, the calibration circuit may be further configured to generate calibration data based on a coarse frequency matching between the reference clock signal and the feedback clock signal. Further, the calibration circuit may be configured to provide the calibration data to the DCO. During the calibration of the digital PLL, the DCO generates the PLL clock signal and the plurality of sampling clock signals based on the calibration data. Further, after the digital PLL is calibrated, the DCO generates the plurality of sampling clock signals and the PLL clock signal based on the calibration data and the control data.

In some embodiments, the digital PLL may further include a divider circuit that may be coupled to the DCO. The divider circuit may be configured to receive the PLL clock signal from the DCO and generate the feedback clock signal based on the PLL clock signal. The feedback clock signal is a frequency-divided version of the PLL clock signal such that a frequency of the feedback clock signal corresponds to a result of a division of a frequency of the PLL clock signal by a division factor of the divider circuit. A loop transfer function of the digital PLL is independent of a gain of the TDC and the division factor.

Phase-locked loops (PLLs) operating in a digital domain (referred to as "digital PLLs") are widely utilized in integrated circuits (ICs) as digital PLLs occupy lesser area on the ICs and have lesser manufacturing cost as compared to analog PLLs. Conventionally, a digital PLL includes a time-to-digital converter (TDC), a digital loop filter, a digitally controlled oscillator (DCO), and a divider circuit that are coupled in the form of a loop. The TDC samples a phase difference between a reference clock signal and a frequency-divided version of a PLL clock signal. The digital loop filter filters the sampled phase difference which is then utilized by the DCO for generating the PLL clock signal. Further, the divider circuit generates the frequency-divided version of the PLL clock signal. The afore-mentioned operations are iterated such that the phase difference between the reference clock signal and the frequency-divided version of the PLL clock signal is less than a tolerance limit associated with the digital PLL (e.g., such that the digital PLL is in a phase-locked state). The stability of the digital PLL is dependent on a gain of the TDC, a gain of the digital loop filter, a gain of the DCO, and a division factor of the divider circuit. The gains of the TDC and the DCO vary with process-voltage-temperature (PVT) variations in the IC, thereby degrading the stability of the digital PLL. Consequently, the phase margin of the digital PLL degrades and the time required for the digital PLL to achieve the phase-locked state increases, thereby resulting in increased jitter in the digital PLL.

Various embodiments of the present disclosure disclose a digital PLL. The digital PLL includes a TDC, a digital loop filter, a DCO, and a divider circuit. The DCO generates a PLL clock signal and various sampling clock signals. The sampling clock signals are mesochronous. The divider circuit generates a feedback clock signal that is a frequency-divided version of the PLL clock signal. The TDC samples a phase difference between a reference clock signal and the feedback clock signal based on the sampling clock signals and various enable signals. The enable signals are generated based on a calibration of the digital PLL. Each enable signal is associated with a sampling clock signal and indicates whether the associated sampling clock signal is to be utilized for sampling the phase difference between the reference clock signal and the feedback clock signal. Further, the TDC generates control data that is indicative of the sampled phase difference, and the digital loop filter filters the control data to generate filtered control data. The DCO generates the PLL clock signal and the sampling clock signals based on the filtered control data. In such a scenario, a loop transfer function of the digital PLL is independent of a gain of the TDC and a division factor of the divider circuit, and is controlled based on a gain of the digital loop filter, a gain of the DCO, and a number of sampling clock signals that are utilized for sampling the phase difference between the reference clock signal and the feedback clock signal.

Thus, the loop transfer function (e.g., a measure of the stability) of the digital PLL of the present disclosure is less sensitive to PVT variations in an IC as compared to the loop transfer function of conventional digital PLLs. As a result, the stability of the digital PLL of the present disclosure is significantly improved as compared to the stability of the conventional digital PLLs. Hence, the time required for the digital PLL of the present disclosure to achieve the phase-locked state is significantly less than that required for conventional digital PLLs, and the phase margin of the digital PLL of the present disclosure is significantly improved as compared to that of the conventional digital PLLs. Consequently, the jitter in the digital PLL of the present disclosure is significantly less than that in the conventional digital PLLs.

FIG. 1 illustrates a schematic block diagram of an integrated circuit (IC) 100 in accordance with an embodiment of the present disclosure. The IC 100 may include a clock generator 102, a digital phase-locked loop (PLL) 104, and a functional circuit 106. The digital PLL 104 may include a calibration circuit 108, a storage element 110, a processing circuit 112, a time-to-digital converter (TDC) 114, a digital loop filter 116, a digitally controlled oscillator (DCO) 118, and a divider circuit 120. The IC 100 may be utilized in automotive devices, networking devices, mobile devices, or the like.

The following table illustrates various signals and data described in FIG. 1:

| Signal/Data | Description |
| --- | --- |
| Reference clock signal RFCK | Clock signal generated by the clock generator 102 and utilized as a reference by the digital PLL 104 |
| First PLL clock signal PCK1 | Output of the digital PLL 104 that is derived from the reference clock signal RFCK |
| Feedback clock signal FBCK | A frequency-divided version of the first PLL clock signal PCK1 |
| Calibration data CLB | Digital code generated based on a frequency difference between the reference clock signal RFCK and the feedback clock signal FBCK during a calibration of the digital PLL 104 |
| Plurality of sampling clock signals SCK1-SCK6 | Utilized by the TDC 114 to sample the phase difference between the reference clock signal RFCK and the feedback clock signal FBCK after the digital PLL 104 is calibrated |
| Plurality of enable signals EB1-EB6 | Associated with the plurality of sampling clock signals SCK1-SCK6, and each enable signal is asserted or de-asserted to indicate whether an associated sampling clock signal is to be utilized or is not to be utilized for the sampling operation, respectively |
| First predefined value PV1 | Indicative of a number of enable signals of the plurality of enable signals EB1-EB6 that are to be asserted |
| Control data CTR | Digital code indicative of the phase difference between the reference clock signal RFCK and the feedback clock signal FBCK that is sampled by the TDC 114 |
| Filtered control data FCTR | A filtered version of the control data CTR |

The clock generator 102 may be coupled to the digital PLL 104. The clock generator 102 may include suitable circuitry that may be configured to perform one or more operations. For example, the clock generator 102 may be configured to generate a reference clock signal RFCK and provide the reference clock signal RFCK to the digital PLL 104. Examples of the clock generator 102 may include resonators, oscillators, or the like.

The digital PLL 104 may be coupled to the clock generator 102 and the functional circuit 106. The digital PLL 104 may be configured to receive the reference clock signal RFCK from the clock generator 102 and generate a first PLL clock signal PCK1 based on the reference clock signal RFCK. The first PLL clock signal PCK1 is generated such that a phase difference between the reference clock signal RFCK and a frequency-divided version of the first PLL clock signal PCK1 is less than a first tolerance limit associated with the digital PLL 104. The first tolerance limit may be equal to 0.01 percent of a time period of the reference clock signal RFCK. However, the first tolerance limit may have other values in other embodiments. The frequency-divided version of the first PLL clock signal PCK1 is hereinafter referred to as a "feedback clock signal FBCK". The first PLL clock signal PCK1 may be updated based on an iterative process to ensure that the phase difference between the reference clock signal RFCK and the feedback clock signal FBCK is less than the first tolerance limit.

When the phase difference between the reference clock signal RFCK and the feedback clock signal FBCK is less than the first tolerance limit, an instantaneous frequency difference between the reference clock signal RFCK and the feedback clock signal FBCK is less than a second tolerance limit associated with the digital PLL 104. The second tolerance limit may be equal to 0.01 percent of a frequency of the reference clock signal RFCK. However, the second tolerance limit may have other values in other embodiments. When the phase difference between the reference clock signal RFCK and the feedback clock signal FBCK is less than the first tolerance limit and the instantaneous frequency difference between the reference clock signal RFCK and the feedback clock signal FBCK is less than the second tolerance limit, the digital PLL 104 is in a phase-locked state.

The digital PLL 104 may be calibrated prior to the phase-locking operation. The calibration of the digital PLL 104 may correspond to a coarse frequency matching between the reference clock signal RFCK and the feedback clock signal FBCK. Thus, during the calibration, the frequency difference between the reference clock signal RFCK and the feedback clock signal FBCK is adjusted such that the frequency difference is equal to the desired value. For example, if an initial frequency difference between the reference clock signal RFCK and the feedback clock signal FBCK is 10 mega-hertz (MHz), the coarse frequency matching may result in the frequency difference between the reference clock signal RFCK and the feedback clock signal FBCK being equal to 100 kilo-hertz (kHz). Further, after the calibration, the digital PLL 104 may be configured to execute a tuning of the phase difference between the reference clock signal RFCK and the feedback clock signal FBCK. The tuning is executed such that the phase difference between the reference clock signal RFCK and the feedback clock signal FBCK is less than the first tolerance limit. In such a scenario, the instantaneous frequency difference between the reference clock signal RFCK and the feedback clock signal FBCK is less than the second tolerance limit. Thus, the tuning of the phase difference results in a fine frequency matching between the reference clock signal RFCK and the feedback clock signal FBCK. The digital PLL 104 may be further configured to provide the first PLL clock signal PCK1 to the functional circuit 106 to facilitate functional operations of the functional circuit 106.

The calibration circuit 108 may be coupled to the clock generator 102, the divider circuit 120, the DCO 118, and the processing circuit 112. The calibration circuit 108 may include suitable circuitry that may be configured to perform one or more operations. For example, the calibration circuit 108 may be configured to receive the reference clock signal RFCK from the clock generator 102 and the feedback clock signal FBCK from the divider circuit 120. Further, the calibration circuit 108 may be configured to generate, to calibrate the digital PLL 104, calibration data CLB based on the frequency difference between the reference clock signal RFCK and the feedback clock signal FBCK. The calibration data CLB is a digital code that is in a binary code format. The calibration data CLB enables the update of the first PLL clock signal PCK1, which in turn updates the feedback clock signal FBCK. The update of the first PLL clock signal PCK1 corresponds to the update of a frequency of the first PLL clock signal PCK1.

The calibration of the digital PLL 104 is thus an iterative process where the first PLL clock signal PCK1 and the feedback clock signal FBCK are updated iteratively until the coarse frequency matching between the reference clock signal RFCK and the feedback clock signal FBCK is achieved. The calibration data CLB is thus generated based on the coarse frequency matching between the reference clock signal RFCK and the feedback clock signal FBCK. The calibration circuit 108 may be further configured to provide the calibration data CLB to the DCO 118 and the processing circuit 112. The calibration circuit 108 is activated (e.g., is operational) during the calibration of the digital PLL 104, and is deactivated (e.g., is non-operational) after the digital PLL 104 is calibrated. The calibration circuit 108 may be configured to receive a first activation signal (not shown) that may control the activation and de-activation of the calibration circuit 108. The IC 100 may include a core circuit (not shown) that may be configured to generate the first activation signal.

The storage element 110 may be coupled to the processing circuit 112. The storage element 110 may include suitable circuitry that may be configured to perform one or more operations. For example, the storage element 110 may be configured to store a mapping between a plurality of predefined frequencies, a predefined calibration data set, and a plurality of predefined values. Each frequency of the plurality of predefined frequencies is indicative of a frequency for which the digital PLL 104 may be in the phase-locked state (e.g., a possible locking frequency of the digital PLL 104). Each predefined data of the predefined calibration data set is indicative of a digital code that may enable the coarse frequency matching between the reference clock signal RFCK and the feedback clock signal FBCK (e.g., the digital code for which the digital PLL 104 is calibrated). Each predefined value of the plurality of predefined values is indicative of a degree of sampling required between the reference clock signal RFCK and the feedback clock signal FBCK after the digital PLL 104 is calibrated to achieve the tuning of the phase difference. The storage element 110 is explained in detail in conjunction with FIG. 4.

The processing circuit 112 may be coupled to the calibration circuit 108, the storage element 110, and the TDC 114. The processing circuit 112 may include suitable circuitry that may be configured to perform one or more operations. For example, the processing circuit 112 may be configured to receive the calibration data CLB from the calibration circuit 108. The processing circuit 112 may be further configured to compare, by accessing the storage element 110, the calibration data CLB with each predefined data of the predefined calibration data set stored in the storage element 110. The calibration data CLB that is compared corresponds to the digital code for which the digital PLL 104 is calibrated.

The processing circuit 112 may be further configured to determine a locking frequency of the digital PLL 104. The locking frequency of the digital PLL 104 is a desired value of the frequency of the first PLL clock signal PCK1 when the digital PLL 104 is in the phase-locked state. The locking frequency of the digital PLL 104 is determined based on a product of the frequency of the reference clock signal RFCK and a division factor of the divider circuit 120 (e.g., a result of a division of the frequency of the first PLL clock signal PCK1 by a frequency of the feedback clock signal FBCK). The frequency of the reference clock signal RFCK and the division factor of the divider circuit 120 may be stored in an internal memory (not shown) of the processing circuit 112 during a boot operation of the IC 100. The processing circuit 112 may be further configured to compare, by accessing the storage element 110, the locking frequency of the digital PLL 104 with each predefined frequency of the plurality of predefined frequencies stored in the storage element 110. The processing circuit 112 performs the comparison operations after the digital PLL 104 is calibrated.

The processing circuit 112 may be further configured to identify, from the plurality of predefined values, a first predefined value PV1 that is associated with the locking frequency of the digital PLL 104 and the calibration data CLB. The processing circuit 112 may identify the first predefined value PV1 based on the comparison of the locking frequency of the digital PLL 104 with each predefined frequency of the plurality of predefined frequencies and the comparison of the calibration data CLB with each predefined data of the predefined calibration data set. The first predefined value PV1 corresponds to a fractional value less than or equal to '1'.

The processing circuit 112 may be further configured to generate a first enable signal EB1, a second enable signal EB2, a third enable signal EB3, a fourth enable signal EB4, a fifth enable signal EB5, and a sixth enable signal EB6 based on the first predefined value PV1 (e.g., the calibration data CLB and the locking frequency of the digital PLL 104). In other words, the first through sixth enable signals EB1-EB6 are generated based on the calibration of the digital PLL 104. The first through sixth enable signals EB1-EB6 are collectively referred to as a "plurality of enable signals EB1-EB6".

Based on the first predefined value PV1 (e.g., the calibration data CLB and the locking frequency of the digital PLL 104), one or more enable signals of the first through sixth enable signals EB1-EB6 are asserted and remaining enable signals of the first through sixth enable signals EB1-EB6 are de-asserted. For example, if the first predefined value PV1 is equal to '0.5', three enable signals of the first through sixth enable signals EB1-EB6 are asserted and the remaining three enable signals are de-asserted. Any three of the first through sixth enable signals EB1-EB6 may be selected for assertion. In one example, the first, third, and fifth enable signals EB1, EB3, and EB5 are asserted and the second, fourth, and sixth enable signals EB2, EB4, and EB6 are de-asserted. In another example, the first through third enable signals EB1-EB3 are asserted and the fourth through sixth enable signals EB4-EB6 are de-asserted. In yet another example, the first, second, and fifth enable signals EB1, EB2, and EB5 are asserted and the third, fourth, and sixth enable signals EB3, EB4, and EB6 are de-asserted.

The processing circuit 112 may be further configured to provide the first through sixth enable signals EB1-EB6 to the TDC 114 to enable the tuning of the phase difference between the reference clock signal RFCK and the feedback clock signal FBCK. The processing circuit 112 may provide the first through sixth enable signals EB1-EB6 to the TDC 114 after the calibration of the digital PLL 104.

The TDC 114 may be coupled to the clock generator 102, the processing circuit 112, the DCO 118, the divider circuit 120, and the digital loop filter 116. The TDC 114 may be configured to receive the reference clock signal RFCK from the clock generator 102, the feedback clock signal FBCK from the divider circuit 120, and the first through sixth enable signals EB1-EB6 from the processing circuit 112. The TDC 114 is deactivated (e.g., is non-operational) during the calibration of the digital PLL 104. The TDC 114 may be deactivated and activated by way of a second activation signal (not shown) that is generated by the core circuit. After the calibration of the digital PLL 104, the TDC 114 is controlled based on the first through sixth enable signals EB1-EB6.

The TDC 114 may be further configured to receive a first sampling clock signal SCK1, a second sampling clock signal SCK2, a third sampling clock signal SCK3, a fourth sampling clock signal SCK4, a fifth sampling clock signal SCK5, and a sixth sampling clock signal SCK6 from the DCO 118. The first through sixth sampling clock signals SCK1-SCK6 are collectively referred to as a "plurality of sampling clock signals SCK1-SCK6".

The plurality of sampling clock signals SCK1-SCK6 is mesochronous. In other words, any two sampling clock signals of the plurality of sampling clock signals SCK1-SCK6 have the same frequency but different phases. In the present disclosure, a frequency of each sampling clock signal of the plurality of sampling clock signals SCK1-SCK6 is equal to the frequency of the first PLL clock signal PCK1. Further, phase differences between the first and third sampling clock signals SCK1 and SCK3, between the third and fifth sampling clock signals SCK3 and SCK5, between the fifth and second sampling clock signals SCK5 and SCK2, between the second and fourth sampling clock signals SCK2 and SCK4, and between the fourth and sixth sampling clock signals SCK4 and SCK6 are equal. In other words, any two sampling clock signals of the plurality of sampling clock signals SCK1-SCK6 have a non-zero phase difference therebetween. Further, the plurality of sampling clock signals SCK1-SCK6 spans one clock cycle (e.g., a time period) of the first PLL clock signal PCK1. Thus, if the time period of the first PLL clock signal PCK1 is 1 nanosecond (ns), the first, third, fifth, second, fourth, and sixth sampling clock signals SCK1, SCK3, SCK5, SCK2, SCK4, and SCK6 are spaced 0.167 ns apart, thereby ensuring that each sampling clock signal of the plurality of sampling clock signals SCK1-SCK6 has a different phase.

The TDC 114 may be further configured to sample the phase difference between the reference clock signal RFCK and the feedback clock signal FBCK based on the first through sixth sampling clock signals SCK1-SCK6 and the first through sixth enable signals EB1-EB6. Each enable signal of the first through sixth enable signals EB1-EB6 is associated with a sampling clock signal of the first through sixth sampling clock signals SCK1-SCK6 and indicates whether the associated sampling clock signal is to be utilized for sampling the phase difference between the reference clock signal RFCK and the feedback clock signal FBCK.

For example, the first through sixth enable signals EB1-EB6 are associated with the first through sixth sampling clock signals SCK1-SCK6 and indicate whether the first through sixth sampling clock signals SCK1-SCK6 are to be utilized for sampling the phase difference between the reference clock signal RFCK and the feedback clock signal FBCK, respectively. Thus, when the first enable signal EB1 is asserted, the first sampling clock signal SCK1 is to be utilized for sampling the phase difference between the reference clock signal RFCK and the feedback clock signal FBCK. Conversely, when the first enable signal EB1 is de-asserted, the first sampling clock signal SCK1 is not to be utilized for sampling the phase difference between the reference clock signal RFCK and the feedback clock signal FBCK.

The TDC 114 thus samples the phase difference between the reference clock signal RFCK and the feedback clock signal FBCK based on one or more sampling clock signals of the plurality of sampling clock signals SCK1-SCK6 that are associated with the one or more asserted enable signals of the plurality of enable signals EB1-EB6, respectively. The TDC 114 may be further configured to generate control data CTR that is indicative of the sampled phase difference. The sampling of the phase difference is an iterative process and for each iteration updated control data CTR may be generated. The control data CTR is a digital code that is in the binary code format. The control data CTR enables the generation of the first PLL clock signal PCK1 and the first through sixth sampling clock signals SCK1-SCK6. Various components of the TDC 114 and their operations are explained in detail in conjunction with FIG. 3.

The digital loop filter 116 may be coupled to the TDC 114 and the DCO 118. The digital loop filter 116 may include suitable circuitry that may be configured to perform one or more operations. For example, the digital loop filter 116 may be configured to receive the control data CTR from the TDC 114. Further, the digital loop filter 116 may be configured to generate filtered control data FCTR and provide the filtered control data FCTR to the DCO 118. In an embodiment, the digital loop filter 116 is a low pass filter. Thus, the digital loop filter 116 may generate the filtered control data FCTR by eliminating high-frequency elements of the control data CTR.

The DCO 118 may be coupled to the functional circuit 106, the calibration circuit 108, the TDC 114, the digital loop filter 116, and the divider circuit 120. The DCO 118 may be configured to receive the calibration data CLB from the calibration circuit 108 and the filtered control data FCTR from the digital loop filter 116. The calibration data CLB is received during the calibration of the digital PLL 104 and the filtered control data FCTR is received after the digital PLL 104 is calibrated. The DCO 118 may be further configured to generate the first PLL clock signal PCK1 and the plurality of sampling clock signals SCK1-SCK6. Further, the DCO 118 may be configured to provide the first PLL clock signal PCK1 to the divider circuit 120 and the functional circuit 106. Additionally, the DCO 118 may be configured to provide the plurality of sampling clock signals SCK1-SCK6 to the TDC 114.

During the calibration of the digital PLL 104, the first PLL clock signal PCK1 and the plurality of sampling clock signals SCK1-SCK6 are generated based on the calibration data CLB. The plurality of sampling clock signals SCK1-SCK6 is not utilized during the calibration of the digital PLL 104 as the TDC 114 is non-operational. The DCO 118 generates the first PLL clock signal PCK1 based on an iterative process. Thus, with each iteration, the frequency difference between the reference clock signal RFCK and the feedback clock signal FBCK is adjusted. Further, after a required number of iterations, the coarse frequency matching between the reference clock signal RFCK and the feedback clock signal FBCK is achieved.

After the digital PLL 104 is calibrated, the DCO 118 generates the first PLL clock signal PCK1 and the plurality of sampling clock signals SCK1-SCK6 based on the filtered control data FCTR (in turn, based on the control data CTR) and the calibration data CLB for which the digital PLL 104 is calibrated. The iterative process continues for achieving the tuning of the phase difference between the reference clock signal RFCK and the feedback clock signal FBCK. For example, the iterative update of the first PLL clock signal PCK1 and the plurality of sampling clock signals SCK1-SCK6 continues until the phase difference between the reference clock signal RFCK and the feedback clock signal FBCK is less than the first tolerance limit. When the phase difference between the reference clock signal RFCK and the feedback clock signal FBCK is less than the first tolerance limit, the instantaneous frequency difference between the reference clock signal RFCK and the feedback clock signal FBCK is less than the second tolerance limit. In such a scenario, the digital PLL 104 is in the phase-locked state. In other words, a coarse tuning operation is implemented based on the calibration data CLB and a fine tuning operation is implemented based on the filtered control data FCTR.

Once the digital PLL 104 is in the phase-locked state, the phase difference between the reference clock signal RFCK and the feedback clock signal FBCK is maintained less than the first tolerance limit (e.g., the digital PLL 104 adjusts to any variations in the IC 100, such as a change in the frequency of the reference clock signal RFCK). Various components of the DCO 118 and their operations are explained in detail in conjunction with FIG. 2.

The divider circuit 120 may be coupled to the calibration circuit 108, the TDC 114, and the DCO 118. The divider circuit 120 may include suitable circuitry that may be configured to perform one or more operations. For example, the divider circuit 120 may be configured to receive the first PLL clock signal PCK1 from the DCO 118 and generate the feedback clock signal FBCK based on the first PLL clock signal PCK1. The feedback clock signal FBCK is derived from the first PLL clock signal PCK1. For example, the feedback clock signal FBCK is the frequency-divided version of the first PLL clock signal PCK1 such that the frequency of the feedback clock signal FBCK corresponds to a result of a division of the frequency of the first PLL clock signal PCK1 by the division factor of the divider circuit 120. In other words, the frequency of the first PLL clock signal PCK1 is "N" times the frequency of the feedback clock signal FBCK, where "N" is the division factor of the divider circuit 120. The divider circuit 120 may be further configured to provide the feedback clock signal FBCK to the calibration circuit 108 and the TDC 114.

The functional circuit 106 may be coupled to the digital PLL 104 (e.g., the DCO 118). The functional circuit 106 may include suitable circuitry that may be configured to perform one or more operations. For example, the functional circuit 106 may be configured to receive the first PLL clock signal PCK1 from the digital PLL 104 and perform one or more functional operations associated therewith based on the first PLL clock signal PCK1. Examples of the functional circuit 106 may include frequency synthesizers, frequency modulators, frequency demodulators, clock recovery circuits, tone decoders, or the like.

In operation, the clock generator 102 may generate the reference clock signal RFCK and the DCO 118 may generate the first PLL clock signal PCK1. The DCO 118 may generate the first PLL clock signal PCK1 based on a predetermined digital code. The divider circuit 120 may generate the feedback clock signal FBCK based on the first PLL clock signal PCK1. The calibration circuit 108 may receive the reference clock signal RFCK and the feedback clock signal FBCK and generate the calibration data CLB based on the frequency difference between the reference clock signal RFCK and the feedback clock signal FBCK. Based on the calibration data CLB, the first PLL clock signal PCK1 and the feedback clock signal FBCK may be updated. The update of the feedback clock signal FBCK may result in the update of the calibration data CLB. The first PLL clock signal PCK1 and the feedback clock signal FBCK may thus be iteratively updated until the reference clock signal RFCK and the feedback clock signal FBCK are coarsely matched for frequency. When the coarse frequency matching between the reference clock signal RFCK and the feedback clock signal FBCK is achieved, the digital PLL 104 is calibrated.

Based on the desired locking frequency of the digital PLL 104 and the calibration data CLB for which the digital PLL 104 is calibrated, the processing circuit 112 may generate the first through sixth enable signals EB1-EB6. The first through sixth enable signals EB1-EB6 may be generated such that the one or more enable signals of the first through sixth enable signals EB1-EB6 are asserted and the remaining enable signals of the first through sixth enable signals EB1-EB6 are de-asserted. The processing circuit 112 may provide the first through sixth enable signals EB1-EB6 to the TDC 114. Further, the DCO 118 may generate and provide the first through sixth sampling clock signals SCK1-SCK6 to the TDC 114. The TDC 114 may sample the phase difference between the reference clock signal RFCK and the feedback clock signal FBCK based on the first through sixth enable signals EB1-EB6 and the first through sixth sampling clock signals SCK1-SCK6. In other words, the TDC 114 may sample the phase difference between the reference clock signal RFCK and the feedback clock signal FBCK based on the one or more sampling clock signals of the first through sixth sampling clock signals SCK1-SCK6 that are associated with the one or more asserted enable signals of the first through sixth enable signals EB1-EB6, respectively.

The TDC 114 may generate the control data CTR that is indicative of the sampled phase difference and provide the control data CTR to the digital loop filter 116. The digital loop filter 116 may generate the filtered control data FCTR based on filtration of the received control data CTR (e.g., by performing a filtering operation on the received control data CTR) and provide the filtered control data FCTR to the DCO 118. The DCO 118 may update the first PLL clock signal PCK1 and the first through sixth sampling clock signals SCK1-SCK6 based on the filtered control data FCTR and the calibration data CLB for which the digital PLL 104 is calibrated. In such a scenario, the update of the first PLL clock signal PCK1 corresponds to the update of the phase of the first PLL clock signal PCK1. Further, the update of the first PLL clock signal PCK1 may result in the update of the feedback clock signal FBCK, and in turn, of the control data CTR.

The first PLL clock signal PCK1, the feedback clock signal FBCK, and the first through sixth sampling clock signals SCK1-SCK6 may thus be iteratively updated until the phase difference between the reference clock signal RFCK and the feedback clock signal FBCK is less than the first tolerance limit. In such a scenario, the instantaneous frequency difference between the reference clock signal RFCK and the feedback clock signal FBCK is less than the second tolerance limit. When the phase difference between the reference clock signal RFCK and the feedback clock signal FBCK is less than the first tolerance limit and the instantaneous frequency difference between the reference clock signal RFCK and the feedback clock signal FBCK is less than the second tolerance limit, the digital PLL 104 is in the phase-locked state. Further, the DCO 118 may provide the first PLL clock signal PCK1 to the functional circuit 106 to facilitate functional operations of the functional circuit 106.

Although it is described that six enable signals and six sampling clock signals are provided to the TDC 114, the scope of the present disclosure is not limited to it. In various other embodiments, the number of enable signals and the number of sampling clock signals may be less than or more than six, without deviating from the scope of the present disclosure.

Figure 2:
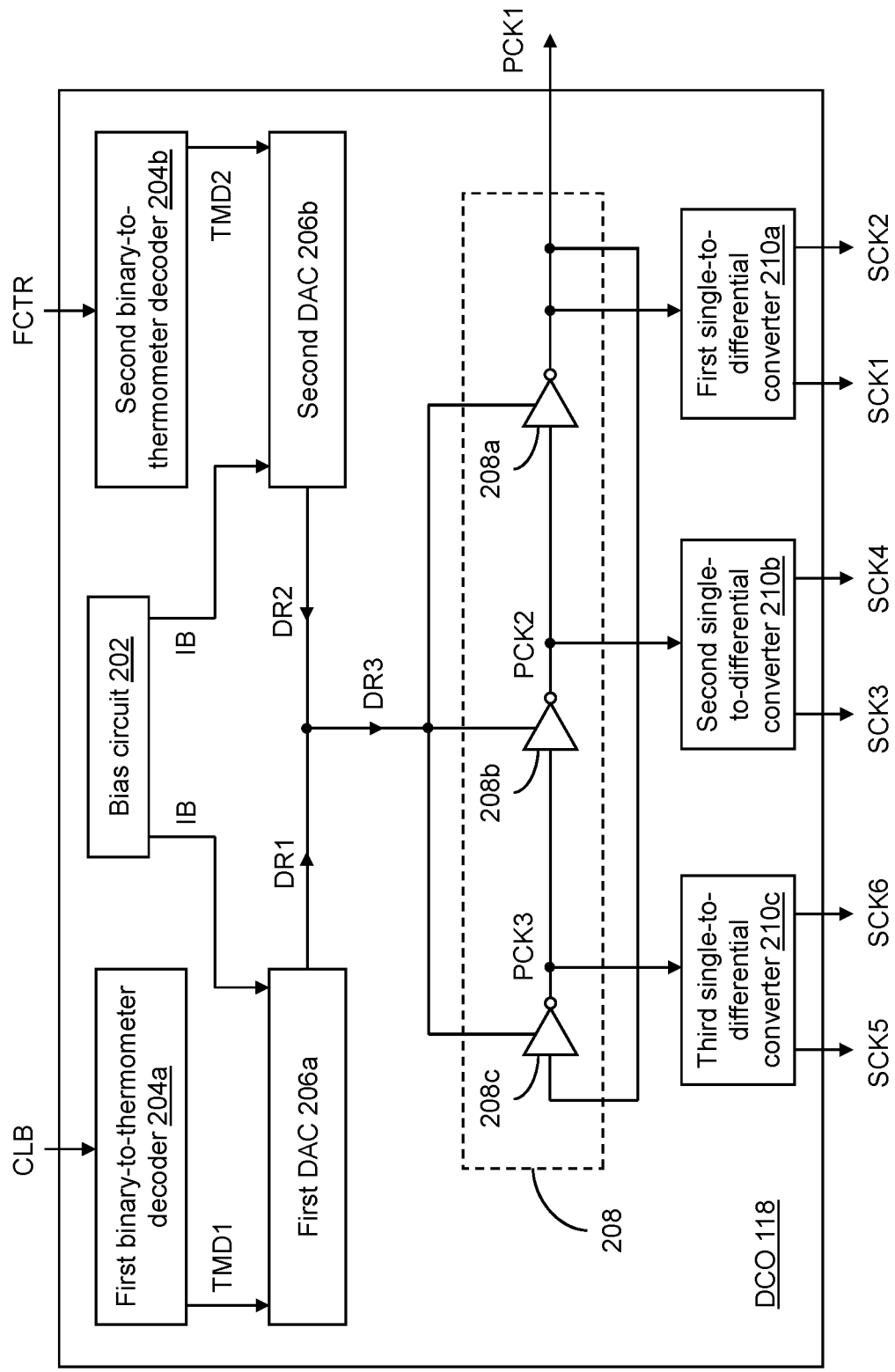
FIG. 2 illustrates a schematic block diagram of a digitally controlled oscillator of the IC of FIG. 1 in accordance with an embodiment of the present disclosure.

FIG. 2 illustrates a schematic block diagram of the DCO 118 in accordance with an embodiment of the present disclosure. The DCO 118 may include a bias circuit 202, a first binary-to-thermometer decoder 204a, a second binary-to-thermometer decoder 204b, a first digital-to-analog converter (DAC) 206a, and a second DAC 206b. The DCO 118 may further include a ring oscillator 208, a first single-to-differential converter 210a, a second single-to-differential converter 210b, and a third single-to-differential converter 210c. The first through third single-to-differential converters 210a-210c are collectively referred to as a "plurality of single-to-differential converters 210a-210c".

The following table illustrates various signals and data described in FIG. 2:

| Signal/Data | Description |
| --- | --- |
| Bias current IB | Current generated by the bias circuit 202 and utilized as a reference by the first and second DACs 206a and 206b |
| First thermometer data TMD1 | Digital code in a thermometer (e.g., unary) code format that is derived from the calibration data CLB |
| Second thermometer data TMD2 | Digital code in the thermometer code format that is derived from the filtered control data FCTR |
| First drive current DR1 | Current generated by the first DAC 206a based on the first thermometer data TMD1 and the bias current IB |
| Second drive current DR2 | Current generated by the second DAC 206b based on the second thermometer data TMD2 and the bias current IB |
| Third drive current DR3 | Sum of the first and second drive currents DR1 and DR2 |
| Plurality of PLL clock signals PCK1-PCK3 | Clock signals generated by the ring oscillator 208 based on the third drive current DR3 |

The bias circuit 202 may be coupled to the first and second DACs 206a and 206b. The bias circuit 202 may include suitable circuitry that may be configured to perform one or more operations. For example, the bias circuit 202 may be configured to generate a bias current IB. The bias circuit 202 may be further configured to provide the bias current IB to the first and second DACs 206a and 206b. The bias circuit 202 may include a current generator (not shown) that may be configured to generate the bias current IB and a current mirror (not shown) that may be configured to mirror the bias current IB. The current generator and the current mirror may be coupled to the first and second DACs 206a and 206b, and may be further configured to provide the bias current IB to the first and second DACs 206a and 206b, respectively.

The first binary-to-thermometer decoder 204a may be coupled to the calibration circuit 108 and the first DAC 206a. The first binary-to-thermometer decoder 204a may include suitable circuitry that may be configured to perform one or more operations. For example, the first binary-to-thermometer decoder 204a may be configured to receive the calibration data CLB from the calibration circuit 108. The calibration data CLB is in the binary code format. The first binary-to-thermometer decoder 204a may be further configured to convert the calibration data CLB to first thermometer data TMD1 which is in a thermometer (e.g., unary) code format. For a 'p' bit calibration data CLB, '$2^p-1$' bit first thermometer data TMD1 is generated. In an exemplary scenario, for 8-bit calibration data CLB, 255-bit first thermometer data TMD1 is generated. In such a scenario, based on the calibration data CLB, a first set of thermometer bits of the first thermometer data TMD1 is in an asserted state and a second set of thermometer bits (e.g., remaining thermometer bits) of the first thermometer data TMD1 is in a de-asserted state.

The first DAC 206a may be coupled to the first binary-to-thermometer decoder 204a, the bias circuit 202, and the ring oscillator 208. The first DAC 206a may be configured to receive the first thermometer data TMD1 from the first binary-to-thermometer decoder 204a and the bias current IB from the bias circuit 202. Based on the first thermometer data TMD1 and the bias current IB, the first DAC 206a may be further configured to generate a first drive current DR1. The first drive current DR1 is thus derived from the calibration data CLB. An amplitude of the first drive current DR1 is controlled based on the first set of thermometer bits of the first thermometer data TMD1.

The first DAC 206a may include a first plurality of converter elements (not shown). A number of thermometer bits of the first thermometer data TMD1 and a number of converter elements included in the first DAC 206a are equal. In an exemplary scenario, for the 255-bit first thermometer data TMD1, the first DAC 206a may include 255 converter elements. Thus, each converter element of the first plurality of converter elements may be configured to receive one thermometer bit of the first thermometer data TMD1 from the first binary-to-thermometer decoder 204a and the bias current IB from the bias circuit 202, and generate an intermediate current (not shown). Each converter element is controlled based on the received thermometer bit. In an embodiment, when the received thermometer bit is in a de-asserted state, the corresponding converter element is deactivated (e.g., is non-operational) and the amplitude of the intermediate current is equal to zero. Conversely, when the received thermometer bit is in an asserted state, the converter element is activated (e.g., is operational) and the intermediate current is a scaled version of the bias current IB.

Thus, the first DAC 206a generates a first plurality of intermediate currents (not shown) (e.g., the first drive current DR1 corresponds to a sum of the first plurality of intermediate currents). Further, a first set of converter elements of the first DAC 206a is activated (e.g., is operational) based on the first set of thermometer bits of the first thermometer data TMD1, and is configured to generate a first set of intermediate currents (not shown) as the scaled version of the bias current IB. A second set of converter elements (e.g., remaining converter elements) of the first DAC 206a receive the second set of thermometer bits of the first thermometer data TMD1, and hence, are de-activated. The amplitude of the intermediate current of each such converter element is equal to zero. The first drive current DR1 may thus correspond to a sum of the first set of intermediate currents generated by the first set of converter elements of the first DAC 206a receiving the set of asserted thermometer bits.

The second binary-to-thermometer decoder 204b may be coupled to the digital loop filter 116 and the second DAC 206b. The second binary-to-thermometer decoder 204b may include suitable circuitry that may be configured to perform one or more operations. For example, the second binary-to-thermometer decoder 204b may be configured to receive the filtered control data FCTR from the digital loop filter 116. The filtered control data FCTR is in the binary code format. The second binary-to-thermometer decoder 204b may be further configured to convert the filtered control data FCTR to second thermometer data TMD2 which is in the thermometer code format. In an exemplary scenario, for 6-bit filtered control data FCTR, 63-bit second thermometer data TMD2 is generated. In such a scenario, based on the filtered control data FCTR, a third set of thermometer bits of the second thermometer data TMD2 is in an asserted state and a fourth set of thermometer bits (e.g., remaining thermometer bits) of the second thermometer data TMD2 is in a de-asserted state.

The second DAC 206b may be coupled to the second binary-to-thermometer decoder 204b, the bias circuit 202, and the ring oscillator 208. The second DAC 206b may be configured to receive the second thermometer data TMD2 from the second binary-to-thermometer decoder 204b and the bias current IB from the bias circuit 202. Based on the second thermometer data TMD2 and the bias current IB, the second DAC 206b may be further configured to generate a second drive current DR2. The second drive current DR2 is thus derived from the filtered control data FCTR and in turn from the control data CTR. An amplitude of the second drive current DR2 is controlled based on the third set of thermometer bits of the second thermometer data TMD2.

The second DAC 206b may include a second plurality of converter elements (not shown). A number of thermometer bits of the second thermometer data TMD2 and a number of converter elements included in the second DAC 206b are equal. In an exemplary scenario, for the 63-bit second thermometer data TMD2, the second DAC 206b may include 63 converter elements. Thus, each converter element of the second DAC 206b may be configured to receive one thermometer bit of the second thermometer data TMD2 from the second binary-to-thermometer decoder 204b and the bias current IB from the bias circuit 202, and generate an associated intermediate current. Each converter element of the second plurality of converter elements is controlled based on the received thermometer bit in a similar manner as described above for the first plurality of converter elements.

Thus, the second DAC 206b generates a second plurality of intermediate currents (not shown) (e.g., the second drive current DR2 corresponds to a sum of the second plurality of intermediate currents). Further, a third set of converter elements of the second DAC 206b is activated (e.g., is operational) based on the third set of thermometer bits of the second thermometer data TMD2, and is configured to generate a second set of intermediate currents (not shown) as the scaled version of the bias current IB. A fourth set of converter elements (e.g., remaining converter elements) of the second DAC 206b receive the fourth set of thermometer bits of the second thermometer data TMD2, and hence, are de-activated. The amplitude of the intermediate current of each such converter element is equal to zero. The second drive current DR2 may thus correspond to a sum of the second set of intermediate currents generated by the third set of converter elements of the second DAC 206b receiving the set of asserted thermometer bits.

Thus, the first drive current DR1 is generated based on the bias current IB and the calibration data CLB and the second drive current DR2 is generated based on the bias current IB and the filtered control data FCTR. Further, a sum of the first and second drive currents DR1 and DR2 is referred to as a third drive current DR3 that facilitates the generation of the first PLL clock signal PCK1 and the plurality of sampling clock signals SCK1-SCK6.

During the calibration of the digital PLL 104, the second DAC 206b operates in a predetermined manner (e.g., one half of the second plurality of converter elements are activated and the other half of the second plurality of converter elements are deactivated). Hence, the second drive current DR2 has a predetermined amplitude. Further, the first drive current DR1 is controlled (e.g., updated) based on the calibration data CLB generated during the calibration of the digital PLL 104. Thus, during the calibration, the sum of such first and second drive currents DR1 and DR2 (e.g., the third drive current DR3) facilitates the coarse frequency matching between the reference clock signal RFCK and the feedback clock signal FBCK. After the digital PLL 104 is calibrated, the amplitude of the first drive current DR1 remains fixed to a value associated with the calibration data CLB for which the digital PLL 104 is calibrated. Further, the second drive current DR2 is controlled (e.g., updated) based on the filtered control data FCTR. Thus, after the digital PLL 104 is calibrated, the sum of such first and second drive currents DR1 and DR2 (e.g., the third drive current DR3) facilitates the tuning of the phase difference (e.g., the fine frequency matching) between the reference clock signal RFCK and the feedback clock signal FBCK. Thus, the first DAC 206a corresponds to a coarse DAC and the second DAC 206b corresponds to a fine DAC.

The ring oscillator 208 may be coupled to the first and second DACs 206a and 206b, the plurality of single-to-differential converters 210a-210c, the divider circuit 120, and the functional circuit 106. The ring oscillator 208 may be configured to receive the third drive current DR3 and generate, based on the third drive current DR3, the first PLL clock signal PCK1, a second PLL clock signal PCK2, and a third PLL clock signal PCK3. The first through third PLL clock signals PCK1-PCK3 are collectively referred to as a "plurality of PLL clock signals PCK1-PCK3". The ring oscillator 208 may be a single-ended ring oscillator and may include an array of odd number of inverters. For example, as shown in FIG. 2, the ring oscillator 208 includes a first inverter 208a, a second inverter 208b, and a third inverter 208c that are coupled in the form of a ring. The first through third inverters 208a-208c may be configured to generate the first through third PLL clock signals PCK1-PCK3, respectively.

The third drive current DR3 regulates a drive strength of each of the first through third inverters 208a-208c. The drive strength of each of the first through third inverters 208a-208c is directly proportional to the amplitude of the third drive current DR3. Further, as the drive strength of each of the first through third inverters 208a-208c increases, the frequency of each of the first through third PLL clock signals PCK1-PCK3 increases. The third drive current DR3 further enables adjustment of the phase and frequency of each of the first through third PLL clock signals PCK1-PCK3. The first through third PLL clock signals PCK1-PCK3 are mesochronous.

The first inverter 208a may be further coupled to the divider circuit 120 and the functional circuit 106, and configured to provide the first PLL clock signal PCK1 to the divider circuit 120 and the functional circuit 106. Further, the first through third inverters 208a-208c may be coupled to the first through third single-to-differential converters 210a-210c, and configured to provide the first through third PLL clock signals PCK1-PCK3 to the first through third single-to-differential converters 210a-210c, respectively.

Although it is described that the first PLL clock signal PCK1 is provided to the divider circuit 120 and the functional circuit 106, the scope of the present disclosure is not limited to it. In various other embodiments, the second PLL clock signal PCK2 or the third PLL clock signal PCK3 may be provided to the functional circuit 106 and the divider circuit 120, without deviating from the scope of the present disclosure.

The first through third single-to-differential converters 210a-210c may be coupled to the ring oscillator 208 (e.g., the first through third inverters 208a-208c, respectively) and the TDC 114. Each of the first through third single-to-differential converters 210a-210c may include suitable circuitry that may be configured to perform one or more operations. For example, the first single-to-differential converter 210a may be configured to receive the first PLL clock signal PCK1 from the first inverter 208a. Based on the first PLL clock signal PCK1, the first single-to-differential converter 210a may be further configured to generate the first sampling clock signal SCK1 and the second sampling clock signal SCK2. In other words, the first single-to-differential converter 210a may be further configured to convert the first PLL clock signal PCK1 to the first sampling clock signal SCK1 and the second sampling clock signal SCK2. The first sampling clock signal SCK1 is in phase with the first PLL clock signal PCK1 and the second sampling clock signal SCK2 is an inverted version of the first sampling clock signal SCK1.

Similarly, the second single-to-differential converter 210b may be configured to receive the second PLL clock signal PCK2 from the second inverter 208b and generate the third and fourth sampling clock signals SCK3 and SCK4 based on the second PLL clock signal PCK2. Further, the third single-to-differential converter 210c may be configured to receive the third PLL clock signal PCK3 from the third inverter 208c and generate the fifth and sixth sampling clock signals SCK5 and SCK6 based on the third PLL clock signal PCK3. The third and fifth sampling clock signals SCK3 and SCK5 are in phase with the second and third PLL clock signals PCK2 and PCK3, respectively. Further, the fourth and sixth sampling clock signals SCK4 and SCK6 are inverted versions of the third and fifth sampling clock signals SCK3 and SCK5, respectively.

The plurality of single-to-differential converters 210a-210c thus receives the plurality of PLL clock signals PCK1-PCK3 and generates the plurality of sampling clock signals SCK1-SCK6 (e.g., the plurality of sampling clock signals SCK1-SCK6 is derived from the plurality of PLL clock signals PCK1-PCK3). The plurality of sampling clock signals SCK1-SCK6 is mesochronous. In other words, any two sampling clock signals of the plurality of sampling clock signals SCK1-SCK6 have the same frequency but different phases. Further, the first through third single-to-differential converters 210a-210c may be configured to provide the plurality of sampling clock signals SCK1-SCK6 to the TDC 114.

Although not shown, the DCO 118 may additionally include first through third level shifters that may be coupled between the first through third inverters 208a-208c and the first through third single-to-differential converters 210a-210c to level-shift the first through third PLL clock signals PCK1-PCK3 before the conversion, respectively.

The scope of the present disclosure is not limited to the ring oscillator 208 including three inverters and the DCO 118 including three single-to-differential converters. In various other embodiments, the number of inverters and the number of single-to-differential converters may be more than three, without deviating from the scope of the present disclosure.

Although it is described that the ring oscillator 208 is a single-ended ring oscillator, the scope of the present disclosure is not limited to it. In various other embodiments, the ring oscillator 208 may be a differential ring oscillator. In such a scenario, the ring oscillator 208 may generate the plurality of sampling clock signals SCK1-SCK6 and the DCO 118 may be sans the plurality of single-to-differential converters 210a-210c.

Figure 3:
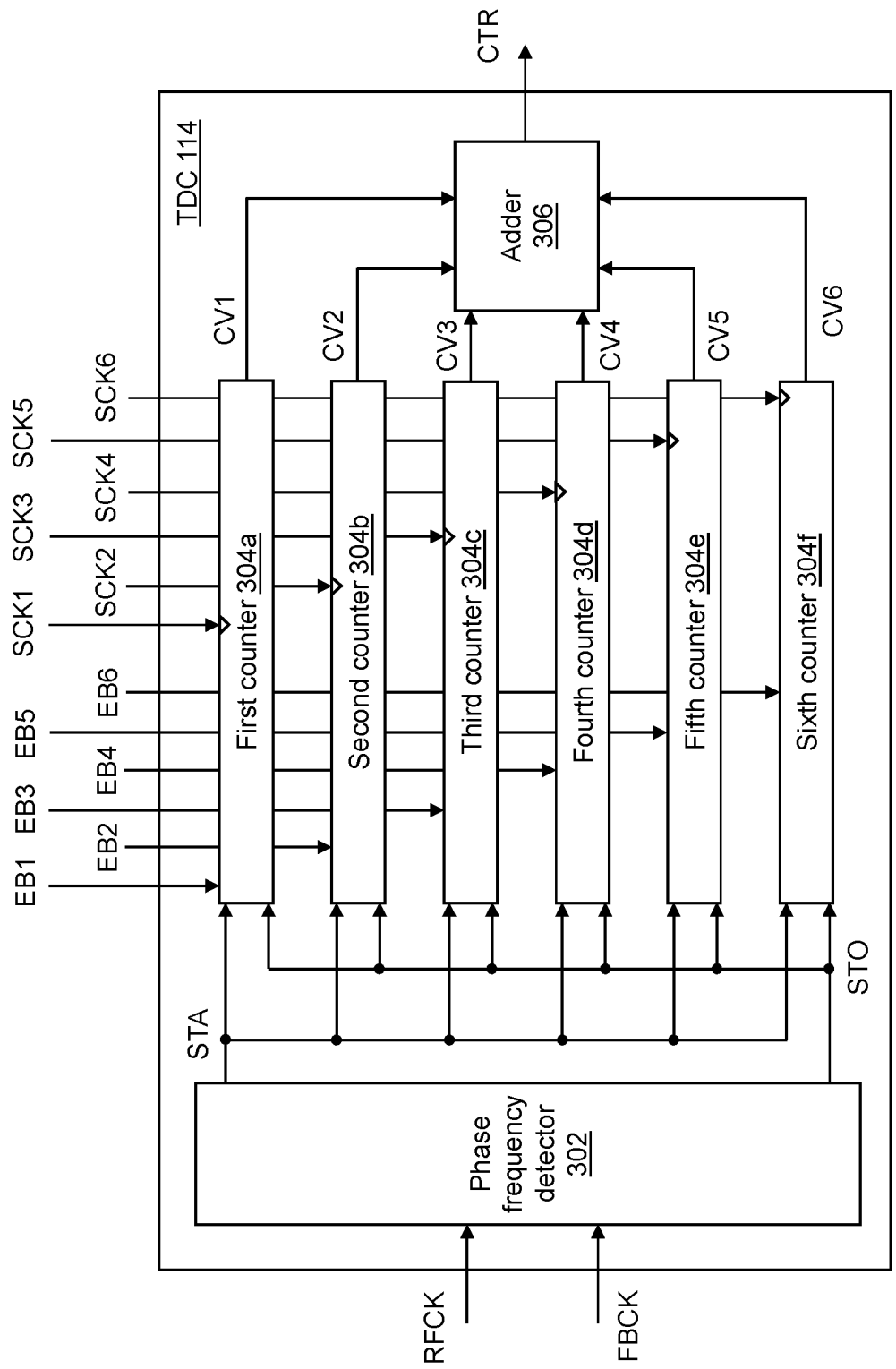
FIG. 3 illustrates a schematic block diagram of a time-to-digital converter of the IC of FIG. 1 in accordance with an embodiment of the present disclosure.

FIG. 3 illustrates a schematic block diagram of the TDC 114 in accordance with an embodiment of the present disclosure. The TDC 114 may include a phase frequency detector 302, a first counter 304a, a second counter 304b, a third counter 304c, a fourth counter 304d, a fifth counter 304e, a sixth counter 304f, and an adder 306. The first through sixth counters 304a-304f are collectively referred to as a "plurality of counters 304a-304f".

The following table illustrates various signals and data described in FIG. 3:

| Signal/Data | Description |
| --- | --- |
| Start signal STA | Initiates counting operations of the plurality of counters 304a-304f |
| Stop signal STO | Halts the counting operations of the plurality of counters 304a-304f |
| Plurality of count values CV1-CV6 | Indicative of a time duration between an assertion of the start signal STA and an assertion of the stop signal STO |

The phase frequency detector 302 may be coupled to the clock generator 102 and the divider circuit 120. The phase frequency detector 302 may include suitable circuitry that may be configured to perform one or more operations. For example, the phase frequency detector 302 may be configured to receive the reference clock signal RFCK and the feedback clock signal FBCK from the clock generator 102 and the divider circuit 120, respectively. Based on the reference clock signal RFCK and the feedback clock signal FBCK, the phase frequency detector 302 may be further configured to generate a start signal STA and a stop signal STO to sample the phase difference between the reference clock signal RFCK and the feedback clock signal FBCK.

The start signal STA is asserted based on an assertion of the reference clock signal RFCK or an assertion of the feedback clock signal FBCK. When the start signal STA is asserted based on the assertion of the reference clock signal RFCK (e.g., when the reference clock signal RFCK is leading the feedback clock signal FBCK), the stop signal STO is asserted based on the assertion of the feedback clock signal FBCK. The start and stop signals STA and STO are then de-asserted until the subsequent assertion of the reference clock signal RFCK. Conversely, when the start signal STA is asserted based on the assertion of the feedback clock signal FBCK (e.g., when the feedback clock signal FBCK is leading the reference clock signal RFCK), the stop signal STO is asserted based on the assertion of the reference clock signal RFCK. The start and stop signals STA and STO are then de-asserted until the subsequent assertion of the feedback clock signal FBCK. A time duration between the assertion of the start signal STA and the assertion of the stop signal STO is indicative of the phase difference between the reference clock signal RFCK and the feedback clock signal FBCK.

The first through sixth counters 304a-304f may be coupled to the phase frequency detector 302, the processing circuit 112, and the plurality of single-to-differential converters 210a-210c. The first through sixth counters 304a-304f may be configured to receive the start signal STA and the stop signal STO from the phase frequency detector 302. Further, the first through sixth counters 304a-304f may be configured to receive the first through sixth sampling clock signals SCK1-SCK6 from the plurality of single-to-differential converters 210a-210c, respectively. The first through sixth counters 304a-304f may be further configured to receive the first through sixth enable signals EB1-EB6 from the processing circuit 112, respectively. Each counter of the plurality of counters 304a-304f is activated based on an assertion of an associated enable signal of the plurality of enable signals EB1-EB6. For example, the first through sixth counters 304a-304f are activated based on the assertion of the first through sixth enable signals EB1-EB6, respectively.

The first through sixth counters 304a-304f may be further configured to generate a first count value CV1, a second count value CV2, a third count value CV3, a fourth count value CV4, a fifth count value CV5, and a sixth count value CV6, respectively. The first through sixth count values CV1-CV6 are collectively referred to as a "plurality of count values CV1-CV6". The plurality of count values CV1-CV6 is indicative of the sampled phase difference between the reference clock signal RFCK and the feedback clock signal FBCK.

When the first enable signal EB1 is asserted, the first counter 304a is activated. In such a scenario, the first count value CV1 is incremented based on the assertion of the start signal STA and each transition of the first sampling clock signal SCK1. For example, the first counter 304a initiates the counting operation when the start signal STA is asserted. Further, the first count value CV1 is incremented at each transition (e.g., at each positive edge or at each negative edge) of the first sampling clock signal SCK1. Further, the first counter 304a is halted based on the assertion of the stop signal STO. Similarly, when the second through sixth enable signals EB2-EB6 are asserted, the second through sixth count values CV2-CV6 are incremented based on transitions of the second through sixth sampling clock signals SCK2-SCK6, respectively, and the assertion of the start signal STA. Further, the second through sixth counters 304b-304f are halted based on the assertion of the stop signal STO. The first through sixth counters 304a-304f thus determine the time duration between the assertion of the start signal STA and the assertion of the stop signal STO.

When the first enable signal EB1 is de-asserted, the first counter 304a is deactivated. In such a scenario, the first count value CV1 is equal to '0'. In other words, the first sampling clock signal SCK1 is not utilized for the sampling operation. Similarly, when the second through sixth enable signals EB2-EB6 are de-asserted, the second through sixth count values CV2-CV6 are equal to '0', and the second through sixth sampling clock signals SCK2-SCK6 are not utilized for the sampling operation, respectively.

The adder 306 may be coupled to the first through sixth counters 304a-304f and the digital loop filter 116. The adder 306 may include suitable circuitry that may be configured to perform one or more operations. For example, the adder 306 may be configured to receive the first through sixth count values CV1-CV6 from the first through sixth counters 304a-304f. Further, the adder 306 may be configured to generate the control data CTR based on the first through sixth count values CV1-CV6. The control data CTR corresponds to a sum of the first through sixth count values CV1-CV6. Such first through sixth count values CV1-CV6 correspond to count values when the stop signal STO is asserted. The adder 306 may be further configured to provide the control data CTR to the digital loop filter 116.

The control data CTR is generated based on a resolution of the TDC 114. The resolution of the TDC 114 corresponds to a minimum time duration between the assertion of the start signal STA and the assertion of the stop signal STO that may be accurately measured by the TDC 114 (e.g., the plurality of counters 304a-304f), and is determined based on a number of counters that are activated.

When the start signal STA is asserted, the counters which are activated initiate the counting operation. As the plurality of sampling clock signals SCK1-SCK6 is mesochronous, all count values are not incremented simultaneously. Based on the time duration between the assertion of the start signal STA and the assertion of the stop signal STO, the count values of the counters which are activated may be different. When the stop signal STO is asserted, the adder 306 generates the control data CTR by summing all the counter values (e.g., the counter values of the counters which are activated and the counter values of the counters which are not activated).

Thus, the control data CTR is indicative of the time duration between the assertion of the start signal STA and the assertion of the stop signal STO. In one example, assuming that all the counters are activated, if the time duration between the assertion of the start signal STA and the assertion of the stop signal STO is 36 picoseconds (ps) and the resolution of the TDC 114 is 6 ps, each count value of the first through sixth count values CV1-CV6 is equal to '1'. Thus, the control data CTR is indicative of the binary equivalent of '6'. In another example, assuming that all the counters are activated, if the time duration between the assertion of the start signal STA and the assertion of the stop signal STO is 54 ps and the resolution of the TDC 114 is 6 ps, each of the first, third, and fifth count values CV1, CV3, and CV5 is equal to the binary equivalent of '2' and each of the second, fourth, and sixth count values CV2, CV4, and CV6 is equal to '1'. Thus, the control data CTR is indicative of the binary equivalent of '9'. If any of the counters are deactivated (e.g., the first predefined value PV1 is less than one), the resolution of the TDC 114 may increase.

Although FIG. 3 illustrates that the TDC 114 includes six counters, the scope of the present disclosure is not limited to it. In various other embodiments, the number of counters in the TDC 114 may be more than six, without deviating from the scope of the present disclosure.

The number of counters in the TDC 114, the number of single-to-differential converters in the DCO 118, and the number of enable signals generated by the processing circuit 112 are determined based on the number of inverters in the ring oscillator 208. For example, if the number of inverters in the ring oscillator 208 is equal to five, the number of single-to-differential converters in the DCO 118 is equal to five, the number of enable signals generated by the processing circuit 112 is equal to ten, and the number of counters in the TDC 114 is equal to ten.

Although it is described that the plurality of counters 304a-304f may be activated and deactivated based on the plurality of enable signals EB1-EB6, the scope of the present disclosure is not limited to it. In various other embodiments, the plurality of counters 304a-304f may be continuously operational, and the TDC 114 may include a plurality of switches between the plurality of counters 304a-304f and the adder 306 with the plurality of switches being controlled by way of the plurality of enable signals EB1-EB6.

FIG. 4 illustrates a schematic diagram of the storage element 110 in accordance with an embodiment of the present disclosure. The storage element 110 may be configured to store the mapping between the plurality of predefined frequencies, the predefined calibration data set, and the plurality of predefined values. In other words, the plurality of predefined frequencies and the predefined calibration data set are mapped to the plurality of predefined values.

The plurality of predefined frequencies may include a first predefined frequency PF1, a second predefined frequency PF2, and a third predefined frequency PF3. The first and second predefined frequencies PF1 and PF2 may be equal to '960' MHz, and the third predefined frequency PF3 may be equal to '480' MHz. However, the first through third predefined frequencies may have other values in other embodiments.

The predefined calibration data set may include first predefined data PD1, second predefined data PD2, and third predefined data PD3. The first predefined data PD1 may be equal to a binary equivalent of '192', the second predefined data PD2 may be equal to a binary equivalent of '225', and the third predefined data PD3 may be equal to a binary equivalent of '160'. However, the first through third predefined data may have other values in other embodiments. The values of '225', '192', and '160' correspond to the digital codes for which the digital PLL 104 may be calibrated.

The plurality of predefined values may include the first predefined value PV1, a second predefined value PV2, and a third predefined value PV3. Each predefined value of the plurality of predefined values is indicative of a number of enable signals of the plurality of enable signals EB1-EB6 that are to be asserted. In other words, each predefined value of the plurality of predefined values is indicative of a number of sampling clock signals of the plurality of sampling clock signals SCK1-SCK6 that are to be utilized for sampling the phase difference between the reference clock signal RFCK and the feedback clock signal FBCK. The first predefined value PV1 may be equal to '0.5', the second predefined value PV2 may be equal to '1', and the third predefined value PV3 may be equal to '0.33'. However, the first through third predefined values may be different (e.g., '0.25', '0.1', '0.75', or the like) in other embodiments. Thus, for the first predefined value PV1 of '0.5', half (e.g., three) of the plurality of enable signals EB1-EB6 are to be asserted. Similarly, for the second and third predefined values PV2 and PV3 of '1' and '0.33', all (e.g., six) and one-third (e.g., two) of the plurality of enable signals EB1-EB6 are to be asserted.

The gain of the DCO 118 is higher for a fast process as compared to a slow process. As a result, the calibration data CLB for the fast process has a lesser value as compared to the slow process. In such a scenario, the predefined value for the fast process is less than that for the slow process. For example, for the same frequency (e.g., '960' MHz), the first predefined data PD1 (e.g., '192') is for the fast process whereas the second predefined data PD2 (e.g., '225') is for the slow process. As a result, the first predefined value PV1 (e.g., '0.5') is less than the second predefined value PV2 (e.g., '1')

The core circuit may be configured to generate and store the mapping between the plurality of predefined frequencies, the predefined calibration data set, and the plurality of predefined values in the storage element 110. The mapping may be stored during the boot operation of the IC 100. The mapping between the plurality of predefined frequencies, the predefined calibration data set, and the plurality of predefined values may be stored in the storage element 110 in the form of a look-up table (LUT) 402. As illustrated by a first row of the LUT 402, the first predefined frequency PF1 and the first predefined data PD1 are mapped to the first predefined value PV1. Similarly, as illustrated by a second row of the LUT 402, the second predefined frequency PF2 and the second predefined data PD2 are mapped to the second predefined value PV2. Further, as illustrated by a third row of the LUT 402, the third predefined frequency PF3 and the third predefined data PD3 are mapped to the third predefined value PV3.

The processing circuit 112 may compare the locking frequency of the digital PLL 104 with each predefined frequency of the plurality of predefined frequencies. Further, the processing circuit 112 may compare the calibration data CLB with each predefined data of the predefined calibration data set. When the locking frequency of the digital PLL 104 and the calibration data CLB match one predefined frequency and one predefined data, respectively, the associated predefined value from the plurality of predefined values is identified. Thus, the first predefined value PV1 is identified when the locking frequency of the digital PLL 104 matches the first predefined frequency PF1 and the calibration data CLB matches the first predefined data PD1.

The scope of the present disclosure is not limited to the LUT 402 including the mapping between three predefined frequencies, three predefined data, and three predefined values. In various other embodiments, a count of the predefined frequencies, a count of the predefined data, and a count of the predefined values may be less than or more than three, without deviating from the scope of the present disclosure.

Although FIG. 4 illustrates that each row of the LUT 402 includes a single frequency and a single digital code (e.g., predefined data), the scope of the present disclosure is not limited to it. In various other embodiments, each row of the LUT 402 may include a range of frequencies and a range of digital codes, without deviating from the scope of the present disclosure. In such a scenario, the processing circuit 112 may compare the locking frequency of the digital PLL 104 with each predefined frequency range of a plurality of predefined frequency ranges and the calibration data CLB with each predefined data range of a plurality of predefined data ranges.

The first through sixth enable signals EB1-EB6 (e.g., the first predefined value PV1) control the sampling of the phase difference between the reference clock signal RFCK and the feedback clock signal FBCK. Thus, the resolution of the TDC 114 is as shown below in equation (1):

$$T_{res} = \frac{T_{PCK1}}{2*PV1*M} \tag{1}$$

where, $T_{res}$ is the resolution of the TDC 114, $T_{PCK1}$ is the time period of the first PLL clock signal PCK1, PV1 is the predefined value identified from the storage element 110, and M is the number of inverters in the ring oscillator 208.

The frequency of the first PLL clock signal PCK1 is a multiple of the frequency of the feedback clock signal FBCK. Further, in the phase-locked state, the instantaneous frequency difference between the reference clock signal RFCK and the feedback clock signal FBCK is less than the second tolerance limit. For the sake of ongoing discussion, it is assumed that the instantaneous frequencies of the reference clock signal RFCK and the feedback clock signal FBCK are equal. Thus, the frequency of the first PLL clock signal PCK1 is a multiple of the frequency of the reference clock signal RFCK as shown below in equation (2):

$$f_{PCK1} = N * f_{RFCK} \tag{2}$$

where, $f_{PCK1}$ is the frequency of the first PLL clock signal PCK1,

N is the division factor of the divider circuit 120, $f_{RFCK}$ is the frequency of the reference clock signal RFCK.

Based on equation (2), the time period of the first PLL clock signal PCK1 may be determined as shown in equation (3):

$$T_{PCK1} = \frac{1}{N} * T_{RFCK} \tag{3}$$

where, $T_{RFCK}$ is the time period of the reference clock signal RFCK.

Substituting equation (3) in equation (1), equation (4) may be obtained as shown below:

$$T_{res} = \frac{T_{RFCK}}{2*PV1*M*N} \tag{4}$$

A gain of the TDC 114 may be determined as shown below in equation (5):

$$K_{TDC} = \frac{T_{RFCK}}{2*\pi*T_{res}} \tag{5}$$

where, $K_{TDC}$ is the gain of the TDC 114.

Substituting equation (4) in equation (5), equation (6) may be obtained as shown below:

$$K_{TDC} = \frac{T_{RFCK}*2*PV1*M*N}{2*\pi*T_{RFCK}} \tag{6}$$

Rearranging equation (6), equation (7) may be obtained as shown below:

$$K_{TDC} = \frac{PV1*M*N}{\pi} \tag{7}$$

A loop transfer function of the digital PLL 104 may be determined as shown below in equation (8):

$$LG(s) = \frac{K_{TDC} * \left(Kp + \frac{Ki}{s}\right) * 2 * \pi * K_{DCO}}{s * N} \quad (8)$$

where,
LG(s) is the loop transfer function of the digital PLL 104,
Kp is a proportional gain of the digital loop filter 116,
Ki is an integral gain of the digital loop filter 116,
$K_{DCO}$ is a gain of the DCO 118, and
s is the representation of the gains in the Laplace domain.

Substituting equation (7) in equation (8), equation (9) may be obtained as shown below:

$$LG(s) = \frac{PV1 * M * N * \left(Kp + \frac{Ki}{s}\right) * 2 * \pi * K_{DCO}}{\pi * s * N} \quad (9)$$

Rearranging equation (9), equation (10) may be obtained as shown below:

$$LG(s) = \frac{\left(Kp + \frac{Ki}{s}\right) * K_{DCO} * 2 * PV1 * M}{s} \quad (10)$$

The loop transfer function of the digital PLL 104 is thus independent of the gain of the TDC 114 and the division factor of the divider circuit 120. The loop transfer function is a measure of the stability of the digital PLL 104. Thus, changes in the gain of the TDC 114, which are a result of process-voltage-temperature (PVT) variations in the IC 100, and/or changes in the division factor do not affect the stability of the digital PLL 104. Thus, the loop transfer function of the digital PLL 104 is controlled based on the gain of the DCO 118, the first predefined value PV1, and the integral and proportional gains of the digital loop filter 116. Further, the integral and proportional gains of the digital loop filter 116 remain constant (e.g., do not change with the PVT variations in the IC 100).

The calibration data CLB for which the digital PLL 104 is calibrated is indicative of a PVT corner associated with the IC 100. Thus, based on the calibration of the digital PLL 104, the first predefined value PV1 is identified such that the first predefined value PV1 is approximately equal to an inverse of the gain of the DCO 118. Thus, a product of '$K_{DCO}$' and 'PV1' may be approximately equal to unity. As a result, the effects of the PVT variations on the loop transfer function are significantly reduced, thereby improving the stability of the IC 100. Consequently, a phase margin in the desired range (e.g., 60 degrees to 72 degrees) may be achieved, which may result in lower overshoot and an improved jitter in the digital PLL 104. Additionally, the time required for the digital PLL 104 to achieve the phase-locked state may be reduced which may further improve the jitter in the digital PLL 104. Further, the time required for the digital PLL 104 to achieve the phase-locked state is independent of the division factor of the divider circuit 120.

Figure 5A:
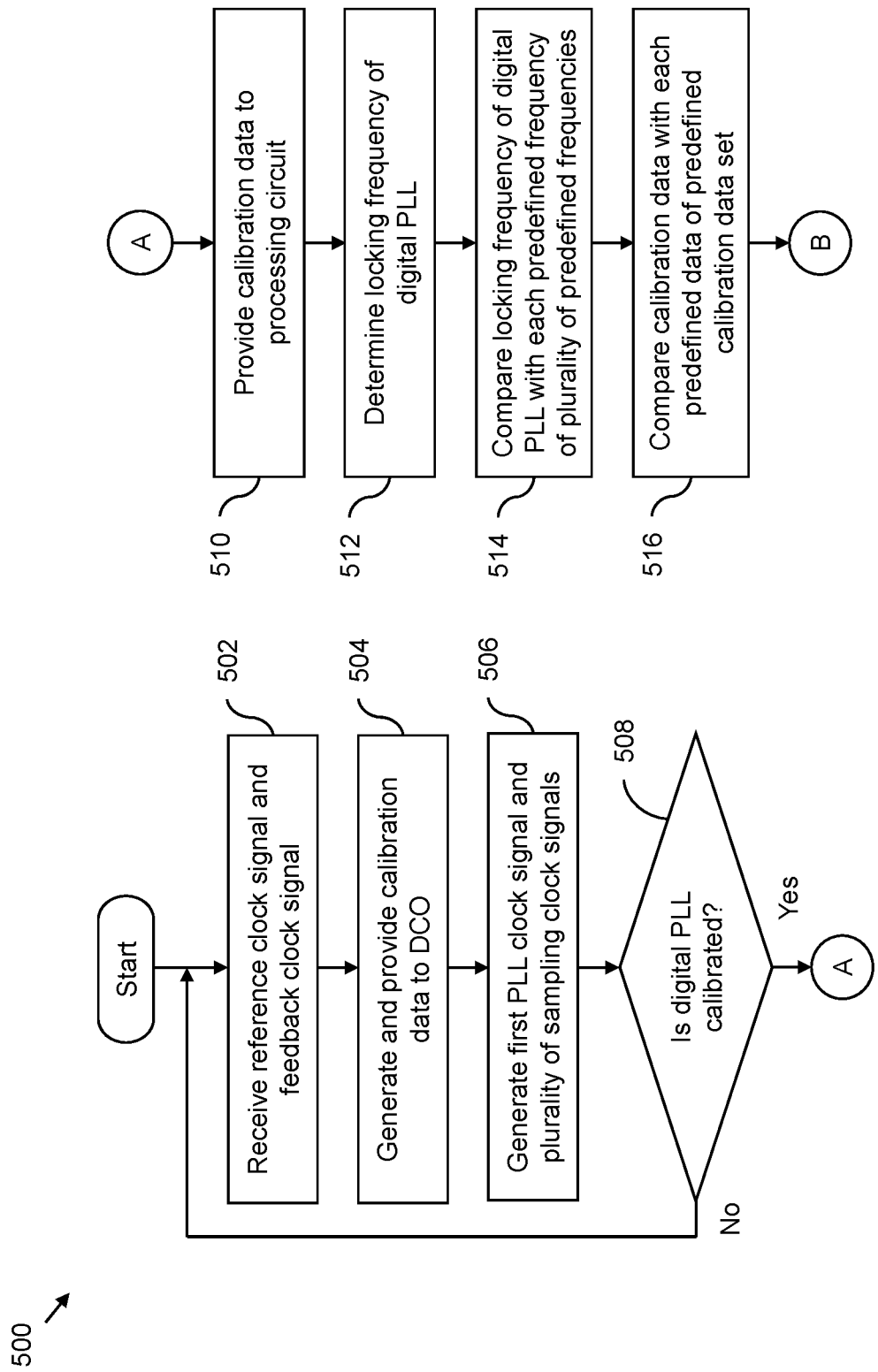
FIGS. 5A and 5B, collectively, represents a flowchart that illustrates a phase-locking method for a digital phase-locked loop of the IC of FIG. 1 in accordance with an embodiment of the present disclosure.
Figure 5B:
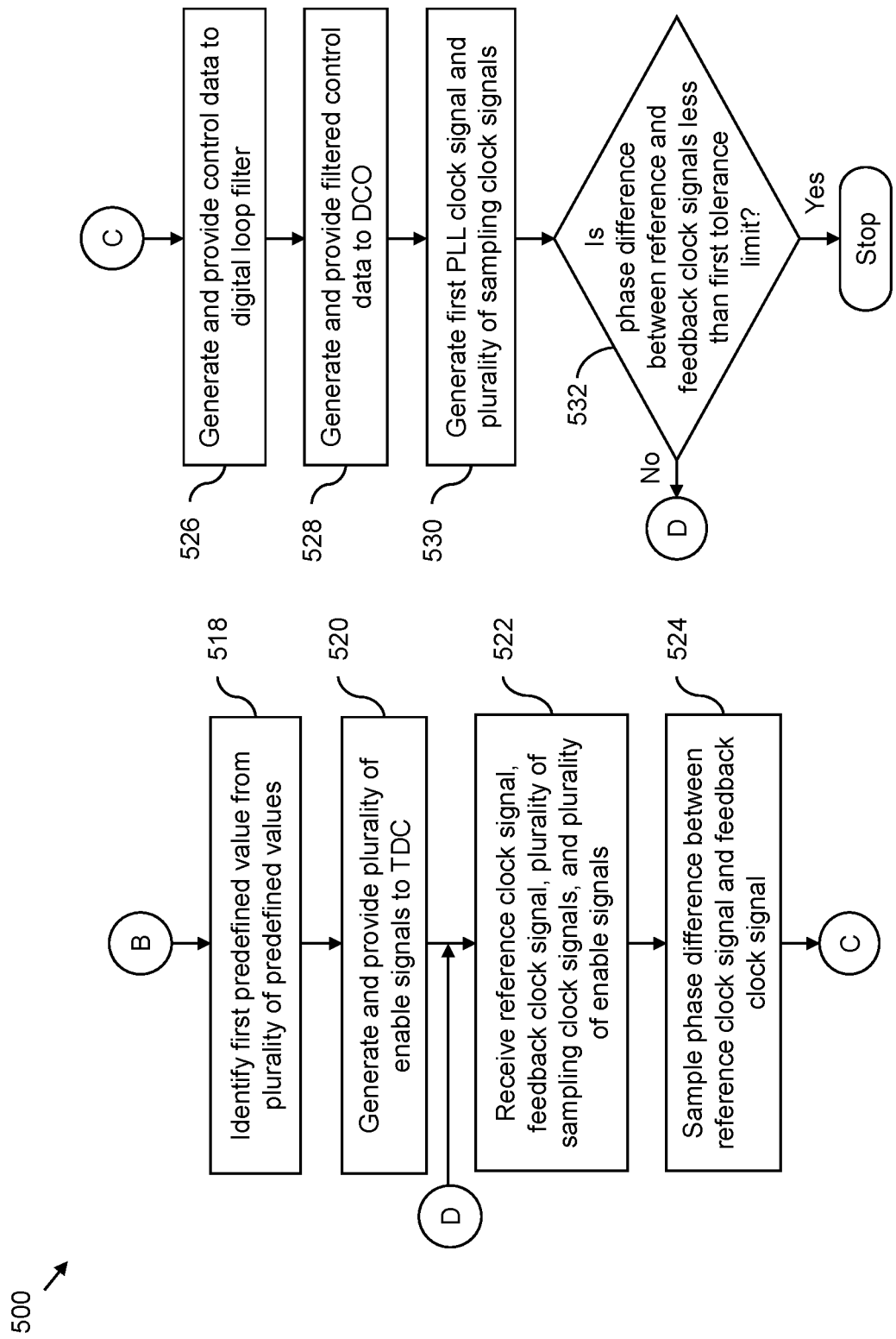

FIGS. 5A and 5B, collectively, represents a flowchart 500 that illustrates a phase-locking method for the digital PLL 104 in accordance with an embodiment of the present disclosure. Referring now to FIG. 5A, at step 502, the calibration circuit 108 may receive the reference clock signal RFCK from the clock generator 102 and the feedback clock signal FBCK from the divider circuit 120. The feedback clock signal FBCK may be derived from the first PLL clock signal PCK1 that may be generated based on the predetermined digital code. At step 504, the calibration circuit 108 may generate the calibration data CLB based on the frequency difference between the reference clock signal RFCK and the feedback clock signal FBCK, and provide the calibration data CLB to the DCO 118. At step 506, the DCO 118 may generate the first PLL clock signal PCK1 and the plurality of sampling clock signals SCK1-SCK6 based on the calibration data CLB.

At step 508, the calibration circuit 108 may determine whether the digital PLL 104 is calibrated. If at step 508, it is determined that the digital PLL 104 is not calibrated, steps 502-508 are repeated. If at step 508, it is determined that the digital PLL 104 is calibrated, step 510 is performed.

At step 510, the calibration circuit 108 may provide the calibration data CLB to the processing circuit 112. Such calibration data CLB corresponds to the digital code for which the digital PLL 104 is calibrated. At step 512, the processing circuit 112 may determine the locking frequency of the digital PLL 104. At step 514, the processing circuit 112 may compare, by accessing the storage element 110, the locking frequency of the digital PLL 104 with each predefined frequency of the plurality of predefined frequencies. At step 516, the processing circuit 112 may compare, by accessing the storage element 110, the calibration data CLB with each predefined data of the predefined calibration data set.

Referring now to FIG. 5B, at step 518, the processing circuit 112 may identify, from the plurality of predefined values to facilitate the generation of the plurality of enable signals EB1-EB6, the first predefined value PV1 that is associated with the locking frequency of the digital PLL 104 and the calibration data CLB. The first predefined value PV1 is identified based on the comparison of the locking frequency of the digital PLL 104 with each predefined frequency of the plurality of predefined frequencies and the comparison of the calibration data CLB with each predefined data of the predefined calibration data set.

At step 520, the processing circuit 112 may generate the plurality of enable signals EB1-EB6 based on the first predefined value PV1 and provide the plurality of enable signals EB1-EB6 to the TDC 114. Based on the identified first predefined value PV1, the one or more enable signals of the plurality of enable signals EB1-EB6 are asserted and the remaining enable signals of the plurality of enable signals EB1-EB6 are de-asserted.

At step 522, the TDC 114 may receive the reference clock signal RFCK from the clock generator 102, the feedback clock signal FBCK from the divider circuit 120, the plurality of sampling clock signals SCK1-SCK6 from the DCO 118, and the plurality of enable signals EB1-EB6 from the processing circuit 112. At step 524, the TDC 114 may sample the phase difference between the reference clock signal RFCK and the feedback clock signal FBCK based on the plurality of sampling clock signals SCK1-SCK6 and the plurality of enable signals EB1-EB6.

At step 526, the TDC 114 may generate the control data CTR based on the sampled phase difference and provide the control data CTR to the digital loop filter 116. At step 528, the digital loop filter 116 may generate the filtered control data FCTR and provide the filtered control data FCTR to the DCO 118. At step 530, the DCO 118 may generate the first PLL clock signal PCK1 and the plurality of sampling clock signals SCK1-SCK6 based on the filtered control data FCTR and the calibration data CLB for which the digital PLL 104 is calibrated.

At step 532, the TDC 114 may determine whether the phase difference between the reference clock signal RFCK and the feedback clock signal FBCK is less than the first tolerance limit. If at step 532, it is determined that the phase difference between the reference clock signal RFCK and the feedback clock signal FBCK is greater than or equal to the first tolerance limit, steps 522-530 are repeated. If at step 532, it is determined that the phase difference between the reference clock signal RFCK and the feedback clock signal FBCK is less than the first tolerance limit, the digital PLL 104 is in the phase-locked state.

PLLs operating in a digital domain (referred to as "digital PLLs") are widely utilized in ICs as digital PLLs occupy lesser area on the ICs and have lesser manufacturing cost as compared to analog PLLs. Conventionally, a digital PLL includes a TDC, a digital loop filter, a DCO, and a divider circuit coupled in the form of a loop. The TDC samples a phase difference between a reference clock signal and a frequency-divided version of a PLL clock signal. The digital loop filter filters the sampled phase difference, which is then utilized by the DCO for generating the PLL clock signal. Further, the divider circuit generates the frequency-divided version of the PLL clock signal. The afore-mentioned operations are iterated until the digital PLL is in a phase-locked state. The stability of the digital PLL is dependent on a gain of the TDC, a gain of the digital loop filter, a division factor of the divider circuit, and a gain of the DCO. The gains of the TDC and the DCO vary with PVT variations in an IC, thereby degrading the stability of the digital PLL. Consequently, a phase margin of the digital PLL degrades and the time required for the digital PLL to achieve the phase-locked state increases, thereby resulting in increased jitter in the digital PLL.

The loop transfer function (e.g., the measure of stability) of the digital PLL 104 is less sensitive to the PVT variations in the IC 100 as compared to that of conventional digital PLLs. As a result, the stability of the digital PLL 104 is significantly improved as compared to the stability of the conventional digital PLLs. Hence, the time required for the digital PLL 104 to achieve the phase-locked state is significantly less than that required for conventional digital PLLs, and the phase margin of the digital PLL 104 is significantly improved as compared to that of the conventional digital PLLs. Consequently, the jitter in the digital PLL 104 is significantly less than that in the conventional digital PLLs.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The term "assert" is used to mean placing a signal in an active state. For example, for an active-low signal, the signal is at a logic low state when asserted, and for an active-high signal, the signal is at a logic high state when asserted.

The invention claimed is:

1. A digital phase-locked loop (PLL), comprising:
   a digitally controlled oscillator (DCO) configured to generate (i) a PLL clock signal and (ii) a plurality of sampling clock signals that is mesochronous; and
   a time-to-digital converter (TDC) that is coupled to the DCO, and configured to:
      sample, based on the plurality of sampling clock signals and a plurality of enable signals, a phase difference between (i) a reference clock signal and (ii) a feedback clock signal that is derived from the PLL clock signal, wherein the plurality of enable signals is generated based on a calibration of the digital PLL, and wherein each enable signal of the plurality of enable signals is associated with a sampling clock signal of the plurality of sampling clock signals and indicates whether the associated sampling clock signal is to be utilized for sampling the phase difference between the reference clock signal and the feedback clock signal; and
      generate control data indicative of the sampled phase difference, wherein after the digital PLL is calibrated, the DCO generates the plurality of sampling clock signals and the PLL clock signal based on the control data such that the phase difference between the reference clock signal and the feedback clock signal is less than a tolerance limit associated with the digital PLL.

2. The digital PLL of claim 1, wherein after the digital PLL is calibrated, the DCO generates the plurality of sampling clock signals and the PLL clock signal further based on calibration data, and wherein the calibration data is generated based on a coarse frequency matching between the reference clock signal and the feedback clock signal during the calibration of the digital PLL.

3. The digital PLL of claim 1, further comprising a storage element configured to store a mapping between (i) a plurality of predefined frequencies, (ii) a predefined calibration data set, and (iii) a plurality of predefined values, wherein each predefined value of the plurality of predefined values is indicative of a number of sampling clock signals of the plurality of sampling clock signals that are to be utilized for sampling the phase difference between the reference clock signal and the feedback clock signal.

4. The digital PLL of claim 3, further comprising a processing circuit that is coupled to the storage element, and configured to:
   compare (i) a locking frequency of the digital PLL with each predefined frequency of the plurality of predefined frequencies and (ii) calibration data with each predefined data of the predefined calibration data set, wherein the calibration data is generated based on a coarse frequency matching between the reference clock signal and the feedback clock signal during the calibration of the digital PLL; and
   identify, from the plurality of predefined values to facilitate the generation of the plurality of enable signals, a first predefined value that is associated with the locking frequency of the digital PLL and the calibration data, wherein the first predefined value is identified based on the comparison of the locking frequency of the digital PLL with each predefined frequency of the plurality of predefined frequencies and the comparison of the calibration data with each predefined data of the predefined calibration data set.

5. The digital PLL of claim 4, wherein the feedback clock signal is derived from the PLL clock signal such that a frequency of the feedback clock signal corresponds to a result of a division of a frequency of the PLL clock signal by a division factor, and wherein the processing circuit is further configured to determine the locking frequency of the digital PLL based on a product of a frequency of the reference clock signal and the division factor.

6. The digital PLL of claim 4, wherein the processing circuit is further coupled to the TDC, and configured to:
generate the plurality of enable signals based on the first predefined value such that one or more enable signals of the plurality of enable signals are asserted and remaining enable signals of the plurality of enable signals are de-asserted; and
provide the plurality of enable signals to the TDC to control the TDC after the calibration of the digital PLL, wherein the TDC samples the phase difference between the reference clock signal and the feedback clock signal based on one or more sampling clock signals of the plurality of sampling clock signals that are associated with the one or more enable signals, respectively.

7. The digital PLL of claim 4, wherein a loop transfer function of the digital PLL is controlled based on a gain of the DCO and the first predefined value.

8. The digital PLL of claim 1, wherein the TDC comprises a phase frequency detector configured to receive the reference clock signal and the feedback clock signal, and generate a start signal and a stop signal to sample the phase difference between the reference clock signal and the feedback clock signal, wherein the start signal is asserted based on an assertion of one of a group consisting of the reference clock signal and the feedback clock signal, wherein when the start signal is asserted based on the assertion of the reference clock signal, the stop signal is asserted based on the assertion of the feedback clock signal, and when the start signal is asserted based on the assertion of the feedback clock signal, the stop signal is asserted based on the assertion of the reference clock signal, and wherein a time duration between the assertion of the start signal and the assertion of the stop signal is indicative of the phase difference between the reference clock signal and the feedback clock signal.

9. The digital PLL of claim 8, wherein the TDC further comprises:
a plurality of counters that is coupled to the phase frequency detector and the DCO, and configured to:
receive the start signal, the stop signal, the plurality of enable signals, and the plurality of sampling clock signals, wherein each counter of the plurality of counters is activated based on an assertion of an associated enable signal of the plurality of enable signals; and
generate a plurality of count values that is indicative of the sampled phase difference between the reference clock signal and the feedback clock signal, wherein the plurality of count values is incremented based on the assertion of the start signal and transitions of the plurality of sampling clock signals, and wherein the plurality of counters is halted based on the assertion of the stop signal; and
an adder that is coupled to the plurality of counters, and configured to generate the control data based on the plurality of count values such that the control data corresponds to a sum of the plurality of count values.

10. The digital PLL of claim 1, further comprising a digital loop filter that is coupled to the TDC and the DCO, and configured to receive the control data from the TDC, generate filtered control data, and provide the filtered control data to the DCO to facilitate the generation of the plurality of sampling clock signals and the PLL clock signal after the digital PLL is calibrated.

11. The digital PLL of claim 1, wherein the DCO comprises a ring oscillator configured to generate a plurality of PLL clock signals based on a sum of (i) a first drive current that is derived from calibration data and (ii) a second drive current that is derived from the control data, wherein the plurality of PLL clock signals comprises the PLL clock signal, wherein the calibration data is generated based on a coarse frequency matching between the reference clock signal and the feedback clock signal during the calibration of the digital PLL, and wherein the plurality of sampling clock signals is derived from the plurality of PLL clock signals.

12. The digital PLL of claim 11, wherein the DCO further comprises a plurality of single-to-differential converters that is coupled to the ring oscillator, and configured to generate the plurality of sampling clock signals based on the plurality of PLL clock signals, wherein a first single-to-differential converter of the plurality of single-to-differential converters is configured to generate, based on the PLL clock signal, a first sampling clock signal of the plurality of sampling clock signals and a second sampling clock signal of the plurality of sampling clock signals, and wherein the first sampling clock signal is in phase with the PLL clock signal and the second sampling clock signal is an inverted version of the first sampling clock signal.

13. The digital PLL of claim 11, wherein the DCO further comprises:
a bias circuit configured to generate a bias current;
a first binary-to-thermometer decoder and a second binary-to-thermometer decoder, wherein the first binary-to-thermometer decoder is configured to receive the calibration data and convert the calibration data that is in a binary code format to first thermometer data that is in a thermometer code format, wherein the second binary-to-thermometer decoder is configured to receive filtered control data and convert the filtered control data that is in the binary code format to second thermometer data that is in the thermometer code format, and wherein the filtered control data is generated based on filtration of the control data; and
a first digital-to-analog converter (DAC) and a second DAC that are coupled to the first binary-to-thermometer decoder and the second binary-to-thermometer decoder, respectively, wherein the first DAC and the second DAC are further coupled to the bias circuit, and wherein the first DAC is configured to generate the first drive current based on the first thermometer data and the bias current, and the second DAC is configured to generate the second drive current based on the second thermometer data and the bias current.

14. The digital PLL of claim 1, further comprising a calibration circuit that is coupled to the DCO, wherein during the calibration of the digital PLL, the calibration circuit is configured to (i) receive the reference clock signal and the feedback clock signal, (ii) generate, to calibrate the digital PLL, calibration data based on a coarse frequency matching between the reference clock signal and the feedback clock signal, and (iii) provide the calibration data to the DCO, wherein during the calibration of the digital PLL, the DCO generates the PLL clock signal and the plurality of sampling clock signals based on the calibration data, and wherein after the digital PLL is calibrated, the DCO generates the plurality of sampling clock signals and the PLL clock signal based on the calibration data and the control data.

15. The digital PLL of claim 1, further comprising a divider circuit that is coupled to the DCO, and configured to receive the PLL clock signal from the DCO, and generate the feedback clock signal based on the PLL clock signal, wherein the feedback clock signal is a frequency-divided version of the PLL clock signal such that a frequency of the feedback clock signal corresponds to a result of a division of a frequency of the PLL clock signal by a division factor of the divider circuit, and wherein a loop transfer function of the digital PLL is independent of the division factor and a gain of the TDC.

16. A phase-locking method for a digital phase-locked loop (PLL), the phase-locking method comprising:
    generating, by a digitally controlled oscillator (DCO) of the digital PLL, (i) a PLL clock signal and (ii) a plurality of sampling clock signals that is mesochronous;
    sampling, by a time-to-digital converter (TDC) of the digital PLL, based on the plurality of sampling clock signals and a plurality of enable signals, a phase difference between (i) a reference clock signal and (ii) a feedback clock signal that is derived from the PLL clock signal, wherein the plurality of enable signals is generated based on a calibration of the digital PLL, and wherein each enable signal of the plurality of enable signals is associated with a sampling clock signal of the plurality of sampling clock signals and indicates whether the associated sampling clock signal is to be utilized for sampling the phase difference between the reference clock signal and the feedback clock signal; and
    generating, by the TDC, control data indicative of the sampled phase difference, wherein after the digital PLL is calibrated, the plurality of sampling clock signals and the PLL clock signal are generated based on the control data such that the phase difference between the reference clock signal and the feedback clock signal is less than a tolerance limit associated with the digital PLL.

17. The phase-locking method of claim 16, wherein after the digital PLL is calibrated, the plurality of sampling clock signals and the PLL clock signal are generated further based on calibration data, and wherein the calibration data is generated based on a coarse frequency matching between the reference clock signal and the feedback clock signal during the calibration of the digital PLL.

18. The phase-locking method of claim 16, further comprising:
    comparing, by a processing circuit of the digital PLL, (i) a locking frequency of the digital PLL with each predefined frequency of a plurality of predefined frequencies and (ii) calibration data with each predefined data of a predefined calibration data set, wherein the calibration data is generated based on a coarse frequency matching between the reference clock signal and the feedback clock signal during the calibration of the digital PLL, wherein the plurality of predefined frequencies and the predefined calibration data set are mapped to a plurality of predefined values, and wherein each predefined value of the plurality of predefined values is indicative of a number of sampling clock signals of the plurality of sampling clock signals that are to be utilized for sampling the phase difference between the reference clock signal and the feedback clock signal; and
    identifying, by the processing circuit, from the plurality of predefined values to facilitate the generation of the plurality of enable signals, a first predefined value that is associated with the locking frequency of the digital PLL and the calibration data, wherein the first predefined value is identified based on the comparison of the locking frequency of the digital PLL with the plurality of predefined frequencies and the comparison of the calibration data with each predefined data of the predefined calibration data set.

19. The phase-locking method of claim 18, further comprising determining, by the processing circuit, the locking frequency of the digital PLL based on a product of a frequency of the reference clock signal and a division factor, wherein the feedback clock signal is derived from the PLL clock signal such that a frequency of the feedback clock signal corresponds to a result of a division of a frequency of the PLL clock signal by the division factor.

20. The phase-locking method of claim 18, further comprising:
    generating, by the processing circuit, the plurality of enable signals based on the first predefined value such that one or more enable signals of the plurality of enable signals are asserted and remaining enable signals of the plurality of enable signals are de-asserted; and
    providing, by the processing circuit, the plurality of enable signals to the TDC to control the TDC after the calibration of the digital PLL, wherein the phase difference between the reference clock signal and the feedback clock signal is sampled based on one or more sampling clock signals of the plurality of sampling clock signals that are associated with the one or more enable signals, respectively.

\* \* \* \* \*